(12) United States Patent
Woo

(10) Patent No.: US 10,937,677 B2
(45) Date of Patent: Mar. 2, 2021

(54) WAFER STORAGE CONTAINER

(71) Applicant: Bum Je Woo, Seongnam (KR)

(72) Inventor: Bum Je Woo, Seongnam (KR)

( * ) Notice: Subject to any disclaimer, the term of this patent is extended or adjusted under 35 U.S.C. 154(b) by 392 days.

(21) Appl. No.: 15/775,771

(22) PCT Filed: Apr. 2, 2018

(86) PCT No.: PCT/KR2018/003876
§ 371 (c)(1),
(2) Date: May 11, 2018

(87) PCT Pub. No.: WO2019/194326
PCT Pub. Date: Oct. 10, 2019

(65) Prior Publication Data
US 2020/0303226 A1    Sep. 24, 2020

(51) Int. Cl.
*B65D 85/30*    (2006.01)
*H01L 21/673*    (2006.01)
*B08B 9/032*    (2006.01)
*B65D 85/00*    (2006.01)
*H01L 21/677*    (2006.01)

(52) U.S. Cl.
CPC ...... *H01L 21/67393* (2013.01); *B08B 9/0321* (2013.01); *B65D 85/00* (2013.01); *H01L 21/6732* (2013.01); *H01L 21/67769* (2013.01)

(58) Field of Classification Search
CPC ......... H01L 21/67769; H01L 21/67393; H01L 21/67386; H01L 21/67383; H01L 21/6732; H01L 21/67017; H01L 21/4817; H01L 21/02041; C23C 16/45563; C23C 16/4412; B65D 85/30

USPC ................. 206/454, 710, 711, 832
See application file for complete search history.

(56) References Cited

U.S. PATENT DOCUMENTS

| | | | |
|---|---|---|---|
| 5,879,458 A * | 3/1999 | Roberson, Jr. | .... H01L 21/67017 118/715 |
| 8,091,592 B2 * | 1/2012 | Sato | ...... F16K 15/063 141/63 |
| 10,672,637 B2 * | 6/2020 | Glavan | ............ H01L 21/67376 |
| 2011/0114534 A1 * | 5/2011 | Watson | ............ H01L 21/67393 206/710 |

(Continued)

FOREIGN PATENT DOCUMENTS

| JP | 2016225352 A | 12/2016 |
|---|---|---|
| JP | 20175082 A | 1/2017 |
| JP | 2017112165 A | 6/2017 |

(Continued)

OTHER PUBLICATIONS

Patent Translate for JP2016-225352 (specification only).*

*Primary Examiner* — Luan K Bui

(57) ABSTRACT

The present invention relates to a wafer storage container capable of removing fumes on a wafer or removing moisture therefrom by supplying purge gas to the wafer stored in a storage chamber. More particularly, the present invention relates to a wafer storage container, in which uniform purge gas injection is achieved and thus formation of dead regions is minimized, formation of turbulence in a storage chamber is prevented and thus wafer purging efficiency is improved, and a size reduction of an injection member injecting purge gas into the storage chamber is achieved and thus a size reduction of the entire wafer storage container is achieved.

6 Claims, 22 Drawing Sheets

(56) References Cited

U.S. PATENT DOCUMENTS

2017/0213752 A1* 7/2017 Ogawa .............. H01L 21/67386

FOREIGN PATENT DOCUMENTS

| KR | 1020130011684 A | 1/2013 |
| KR | 1020150045354 A | 4/2015 |
| KR | 10-1670383 B1 | 10/2016 |

* cited by examiner

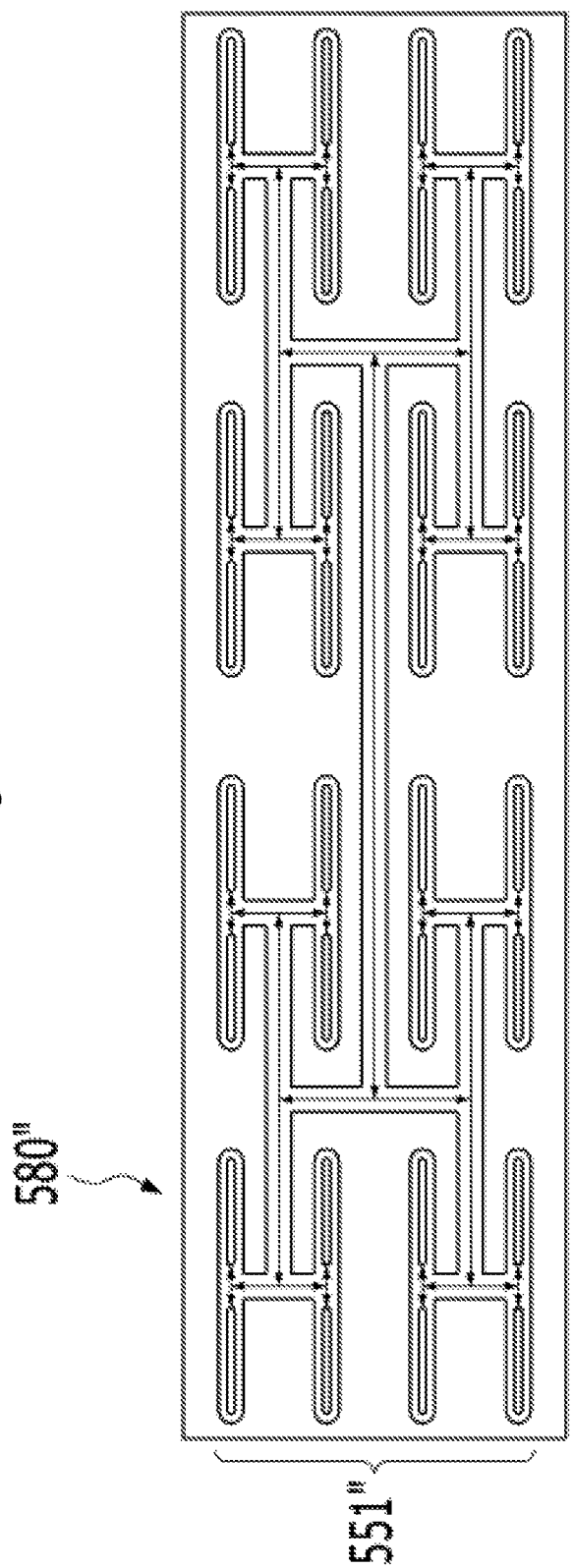

WAFER STORAGE CONTAINER

This application is a U.S. National Stage of International Patent Application No. PCT/KR2018/003876, filed on Apr. 2, 2018, the disclosure of which is incorporated herein by reference.

TECHNICAL FIELD

The present invention relates generally to a wafer storage container and, more particularly, to a wafer storage container capable of removing fumes on a wafer or removing moisture therefrom by supplying purge gas to the wafer stored in a storage chamber.

BACKGROUND ART

In general, semiconductor devices are manufactured by performing selection and repeating a series of unit processes on wafers such as deposition, polishing, photolithography, etching, ion implantation, cleaning, inspection, thermal treatment, etc. The wafers are transferred to a predetermined location required in each process to manufacture semiconductor devices.

Such wafers require high precision processes and are stored in or transferred to and from a wafer storage container such as a front-opening unified pod (FOUP), etc. so as to avoid contamination or damage from external contaminants and impact.

In this case, process gases used during the processes, fumes that are by-products produced during the processes, etc. may not be eliminated but remain on the surfaces of the wafers. As a result, the residual substances may consequently contaminate semiconductor manufacturing equipment during the processes and etch pattern defects, etc. may occur, resulting in degrading reliability of the wafers.

In order to solve such problems, purging techniques are being developed to supply purge gas to the wafers stored in the wafer storage container to remove fumes remaining on the surfaces of the wafers or to prevent oxidation of the wafers.

It is noted that Korean Patent No. 10-1637498 (hereinafter referred to as 'Patent Document 1') discloses technology regarding a wafer storage container capable of supplying purge gas as described above.

The wafer storage container disclosed in Patent Document 1 includes: a storage chamber in which wafers are stored, a first gas injection chamber communicating with the storage chamber; a first isolation wall allowing the storage chamber and the first gas injection chamber to be separated into isolated spaces and provided with multiple first holes through which gas flows; a second gas injection chamber communicating with the storage chamber; a second isolation wall allowing the storage chamber and the second gas injection chamber to be separated into isolated spaces and provided with multiple second holes through which the gas flows; a gas exhaust chamber communicating with the storage chamber, a third isolation wall allowing the storage chamber and the gas exhaust chamber to be separated into isolated spaces and provided with multiple third holes through which the gas flows; and multiple plates configured to support the wafers.

Accordingly, the gas introduced into the first and second gas injection chambers is injected into the storage chamber through the first and second holes, and is then exhausted to the gas exhaust chamber through the third holes together with fumes remaining on the surfaces of the wafers, thus achieving fume removal of the wafers.

However, the wafer storage container disclosed in Patent Document 1 is problematic in that when the gas introduced into the first and second gas injection chambers through gas inlet holes is injected into the storage chamber through the first and second holes, there is a limitation to uniformly injecting the gas into the storage chamber.

In detail, because the first and second gas injection chambers are structured in a simple chamber shape, there is an inevitable difference between an injection force of the gas injected into the storage chamber from lower regions of the first and second gas injection chambers through the first and second holes and an injection force of the gas injected into the storage chamber from an upper region of the first and second gas injection chambers through the first and second holes. Thus, there is a limitation to uniformly eliminating the fumes remaining on the wafers stored in the storage chamber.

In addition, there is a possibility that non-uniformity in gas injection force may occur in regions positioned relatively far from the gas inlet holes as well as the upper and lower regions of the first and second gas injection chamber described above. In other words, the non-uniformity in gas injection force may occur at both vertical and horizontal positions in the first and second gas injection chambers, which contributes to formation of turbulence of the gas injected into the storage chamber.

As described above, because the gas injected into the storage chamber forms turbulence, there is a limitation that purging may not be uniformly performed with respect to the entire region of the wafers.

Moreover, in view of the injection force of the gas, because the gas is introduced into the first and second gas injection chambers having a relatively large volume through the gas inlet holes having a relatively small diameter, there is a limitation in that a flow force of the gas, that is, the flow velocity of the gas, may not be maintained. As a result, an injection force of the gas (the flow velocity of the gas) injected into the storage chamber through the first and second holes may significantly decrease. Thus, the degree of formation of dead regions where wafer purging is not performed may increase.

DOCUMENTS OF RELATED ART

Patent Document
(Patent Document 1) Korean Patent No. 10-1670383

DISCLOSURE

Technical Problem

Accordingly, the present invention has been made keeping in mind the above problems occurring in the related art, and the present invention provides a wafer storage container, in which uniform purge gas injection is achieved and thus formation of dead regions is minimized, formation of turbulence in a storage chamber is prevented and thus wafer purging efficiency is improved, and a size reduction of an injection member injecting purge gas into the storage chamber is achieved and thus a size reduction of the entire wafer storage container is achieved.

Technical Solution

In order to accomplish the above objects, according to one aspect of the present invention, there is provided a wafer storage container, including: a storage chamber in which a wafer received through an front opening is stored; and an injection member disposed on at least a portion of a circumferential surface of the storage chamber and injecting purge gas into the storage chamber, wherein the injection member includes: an inflow hole through which the purge gas flows into the injection member; multiple injection holes arranged on the portion of the circumferential surface of the storage chamber such that the purge gas is injected into the storage chamber through the injection holes; and a branch passage portion having at least one branch section such that the purge gas having flowed through the inflow hole is allowed to flow to the multiple injection holes, the branch passage portion being provided on a surface parallel to the portion of the circumferential surface of the storage chamber.

Further, the branch passage portion may include: a main passage communicating with the inflow hole and formed in a vertical direction of the surface parallel to the portion of the circumferential surface of the storage chamber; and multiple branch passages allowing the main passage and each of the multiple injection holes to communicate with each other, and configured such that the branch passages are branched symmetrically with each other with respect to the main passage to form the branch section, the branch passages being formed in horizontal directions of the surface parallel to the portion of the circumferential surface of the storage chamber.

Further, the inflow hole may be formed to be positioned at a center of a vertical length of the main passage.

Further, the purge gas having flowed from the inflow hole to each of the multiple injection holes through the branch passage portion may have the same flow distance.

Further, the branch section of the branch passage portion may be formed such that two branch passages are branched in opposite directions.

Further, the injection member may further include: an injection plate having the multiple injection holes and the branch passage portion; and an inflow plate coupled to the injection plate and having the inflow hole, wherein the multiple injection holes are formed on a first surface of the injection plate, and the branch passage portion is formed on a second surface of the injection plate.

Further, the injection member may be disposed between the injection plate and the inflow plate and may further include an additional passage plate having an additional passage allowing the inflow hole and the branch passage portion to communicate with each other.

Advantageous Effects

The wafer storage container according to the present invention as described above has the following effects.

The passage structure of the injection member enables that the flow velocity of the purge gas supplied from the external supply part can be maintained compared to a chamber-type injection member of the wafer storage container in the related art. Thus, the injection speed of the purge gas injected from the injection hole is higher than that of the wafer storage container in the related art, whereby formation of dead regions in the storage chamber can be minimized.

It is possible to individually control purging into the bottom region, the middle region, and the top region in the storage chamber.

It is possible to achieve efficient wafer purging while achieving a size reduction of both the injection member and the wafer storage chamber.

The flow rate of the purge gas injected through the injection holes of the injection member is uniform, so that it is possible to prevent formation of turbulence in the storage chamber attributable to the non-uniform injection of the purge gas and thereby to achieve formation of flow of the purge gas in the storage chamber.

The injection member is easily engaged and disengaged, so that in a case where the wafer storage container is used for a long period of time and thus contaminants accumulate in the injection member, easy replacement thereof is possible, thus achieving easy maintenance.

The injection holes of the injection member varies in the position and opening area according to the disposition position of the injection member disposed in the wafer storage container, so that it is possible to achieve formation of an optimized flow of the purge gas in the storage chamber and thereby to effectively prevent formation of dead regions.

It is possible to achieve fume removal of the wafer by selectively block exhaust of the exhaust member for purge gas and fume exhaust and purge gas injection in the storage chamber, and to achieve humidity control in the storage chamber by filling the storage chamber with the purge gas.

DESCRIPTION OF DRAWINGS

FIG. 17 is a view showing flow of the purge gas flowing through the injection plate of FIG. 16(b).

MODE FOR INVENTION

Figure 1:
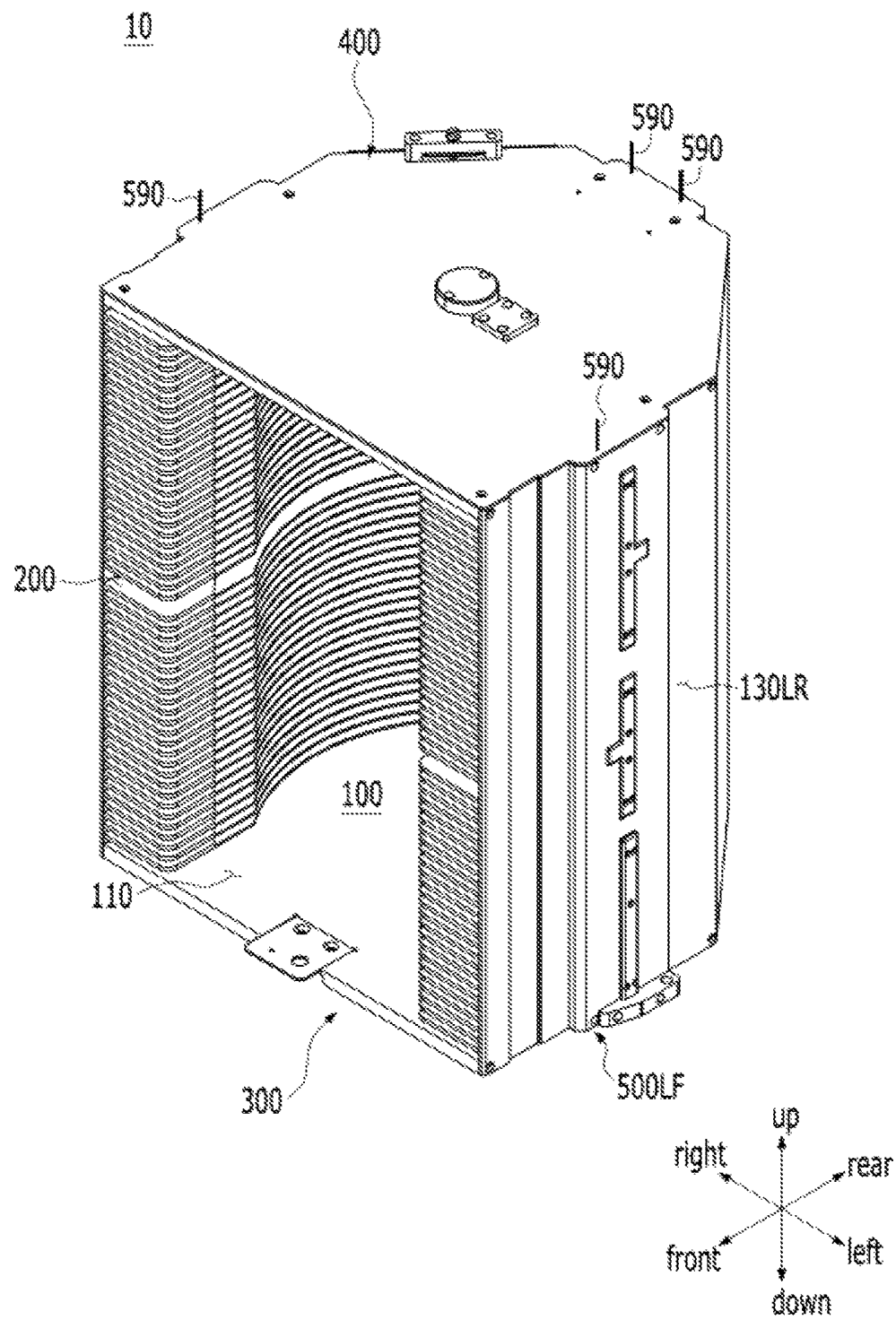
FIG. 1 is a perspective view showing a wafer storage container according to a preferable embodiment of the present invention.

The term 'purge gas' referred to below refers generally to an inert gas for removing fumes on a wafer. In particular, it may be a nitrogen ($N_2$) gas which is used as the inert gas.

In addition, the term 'purging' refers generally to a method of preventing oxidation of the wafer by eliminating the fumes that remain on the surface of the wafer through injection of purge gas onto the wafer, or by eliminating moisture in a storage chamber.

A wafer storage container according to a preferable embodiment of the present invention includes: a storage chamber in which a wafer received through a front opening is stored; a support provided in the storage chamber and supporting the wafer; a lower plate forming a lower surface of the wafer storage container; an upper plate forming an upper surface of the wafer storage container; an injection member disposed on at least a portion of a circumferential surface of the storage chamber and injecting purge gas; and an exhaust member disposed on at least a remaining portion of the circumferential surface of the storage chamber and exhausting the purge gas.

The front opening is formed in a front surface of the storage chamber, and the wafer enters and exits the storage chamber through the front opening.

The support is provided in the storage chamber and serves to support the wafer, and the wafer is received in the support through the front opening formed in the front surface of the storage chamber.

The upper plate and the lower plate constitute the upper and lower surfaces of the wafer storage container, respectively. Accordingly, the upper and lower surfaces of the storage chamber are closed by the upper plate and the lower plate.

The lower plate is provided with a supply hole and a supply passage communicating with the supply hole. When the purge gas is supplied from outside through the supply hole and then flows into the lower plate, the purge gas having flowed is allowed to flow to the injection member through the supply passage.

The injection member is disposed on at least the portion of the circumferential surface of the storage chamber in which the wafer is stored and serves to inject into the storage chamber the purge gas having flowed through the passage of the lower plate formed in the lower plate.

The injection member includes an inflow hole communicating with the supply passage and through which the purge gas flows into the injection member, multiple injection holes arranged on the portion of the circumferential surface of the storage chamber where the injection member is disposed and injecting the purge gas into the storage chamber, and a branch passage portion having at least one branch section to allow the purge gas having flowed through the inflow hole to the multiple injection holes. In this case, the branch passage portion is provided on a surface parallel to the portion of the circumferential surface of the storage chamber where the injection member is disposed.

The exhaust member serves to exhaust the purge gas injected into the storage chamber and the fumes on the wafer and is disposed on at least the remaining portion of the circumferential surface of the storage chamber in which the wafer is stored, the remaining portion where no injection member is disposed, that is, on the remaining portion of the circumferential surface of the storage chamber rather than at least the portion of the circumferential surface thereof.

As described above, the wafer storage container is provided with the injection member for injecting the purge gas into the storage chamber and the exhaust member for exhausting the purge gas, whereby it is possible to achieve fume removal and moisture control of the wafer stored in the storage chamber.

In other words, the injection member injects the purge gas into the storage chamber and the exhaust member exhausts the purge gas injected into the storage chamber by the injection member and the fumes on the wafer, thus achieving fume removal of the wafer. Alternatively, in a state in which the exhaust member is not allowed to perform exhaust, the injection member injects the purge gas into the storage chamber, thus achieving moisture control of the wafer.

The injection member and the exhaust member may be provided in plural depending on the size, purpose, etc. of the wafer storage container.

For example, in a case where the front opening is provided in the front surface of the storage chamber, and the circumferential surface of the storage chamber is divided into a left front surface, a left rear surface, a middle rear surface, a right rear surface, and a right front surface in an order from left to right, multiple injection members may be configured with a left front injection member disposed on the left front surface of the circumferential surface of the storage chamber, a right front injection member disposed on the right front surface of the circumferential surface of the storage chamber, and a middle rear injection member disposed on the middle rear surface of the circumferential surface of the storage chamber.

In addition, multiple exhaust members may be disposed on the left rear surface and the right rear surface of the circumferential surface of the storage chamber, the left rear and right rear surfaces having no injection member disposed thereon.

Hereinafter, as one embodiment of the wafer storage container 10 according to the preferable embodiment of the present invention, there will be representatively described a wafer storage container 10 configured with: multiple injection members 500 including a left front injection member 500LF, a right front injection member 500RF, and a middle rear injection member 500MR respectively disposed on a left front surface, a right front surface, and a middle rear surface of a circumferential surface of a storage chamber 100; and an exhaust member 600 disposed on a right rear surface of the circumferential surface of the storage chamber 100, the right rear surface having no injection member 500 disposed thereon.

In this case, the left front injection member 500LF indicates that the injection member 500 is disposed at the left front, and the right front injection member 500RF indicates that the injection member 500 is disposed at the right front, and the middle rear injection member 500MR indicates that the injection member 500 is disposed at the middle rear.

In other words, the left front injection member 500LF, the right front injection member 500RF, and the middle rear injection member 500MR differ only in disposition positions thereof but remain the same in configurations thereof. Thus, in the following description, the left front injection member 500LF is representatively described, and a duplicate description of the remaining right front injection member 500RF and middle rear injection member 500MR will be replaced with a description of the left front injection member 500LF.

Furthermore, the disposition positions of the left front injection member 500LF, the right front injection member 500RF and the middle rear injection member 500MR is designated for ease of explanation, so that regardless of terminology, the left front injection member 500LF, the right front injection member 500RF, and the middle rear injection member 500MR all will be understood as the injection member 500.

Furthermore, 'B (BOTTOM), M (MIDDLE), and T (TOP)' are added to the reference numerals of passages and holes respectively corresponding to a lower region, a middle region, and a upper region in order to facilitate understanding thereof. Thus, as described above, even if there are reference numerals without 'B, M, and T' shown in the drawings, they will be understood as the passages and holes respectively corresponding to the lower region, the middle region, and the upper region.

A wafer storage container 10 according to a preferable embodiment of the present invention Hereinafter, a wafer storage container 10 according to a preferable embodiment of the present invention will be described with reference to FIGS. 1 to 11.

Figure 2:
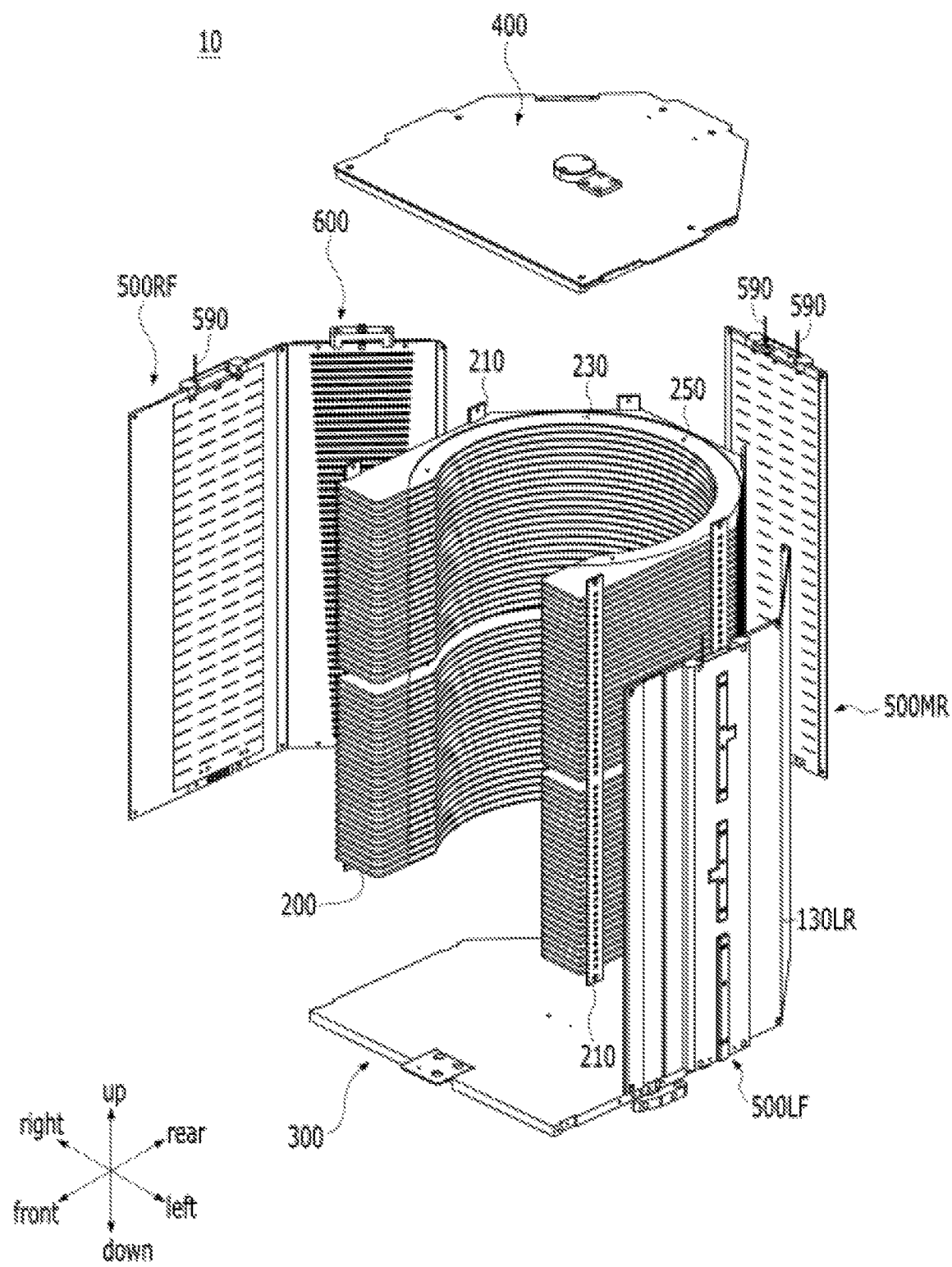
FIG. 2 is an exploded perspective view of FIG. 1.
Figure 3:
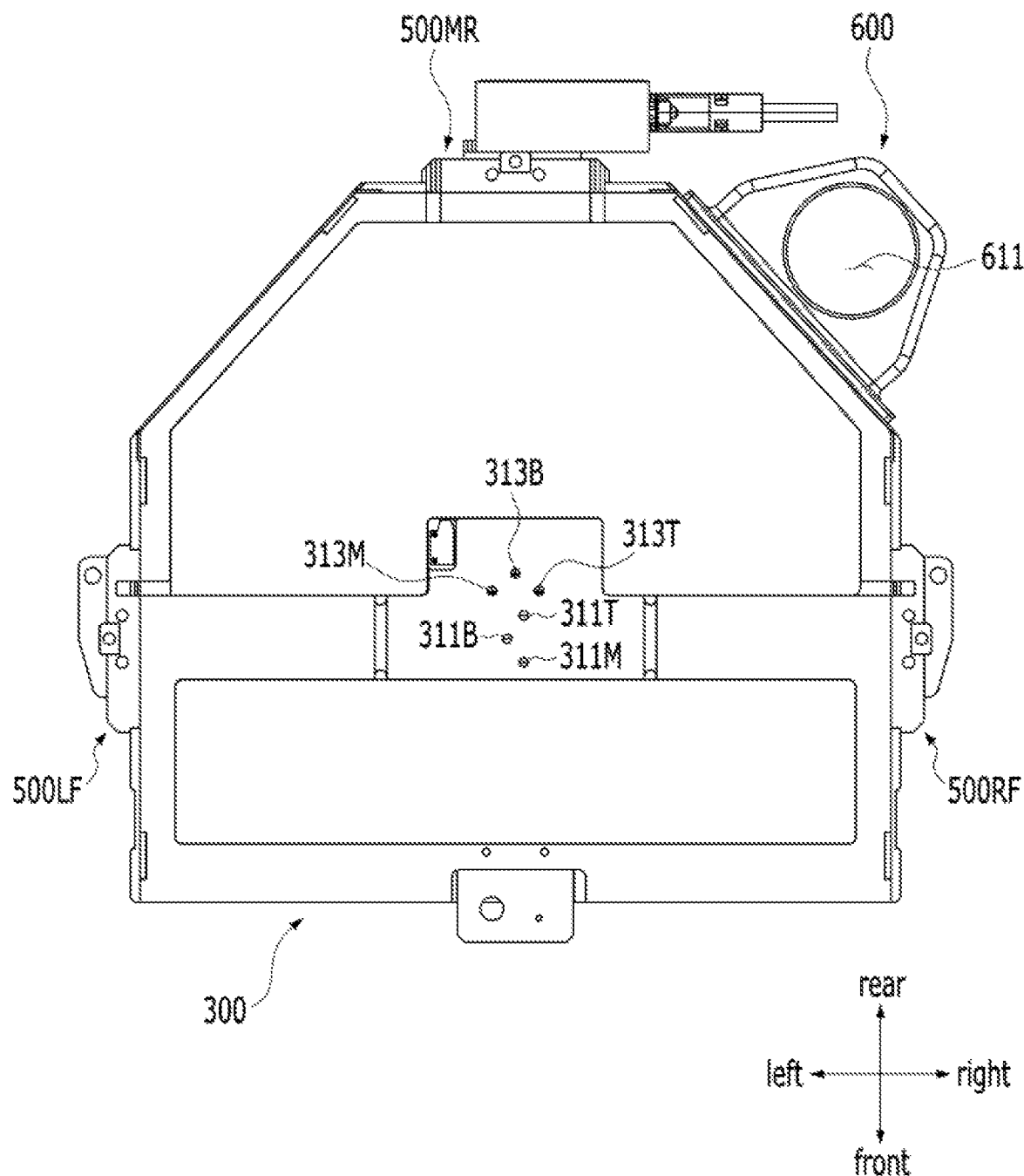
FIG. 3 is a bottom view of FIG. 1.
Figure 4:
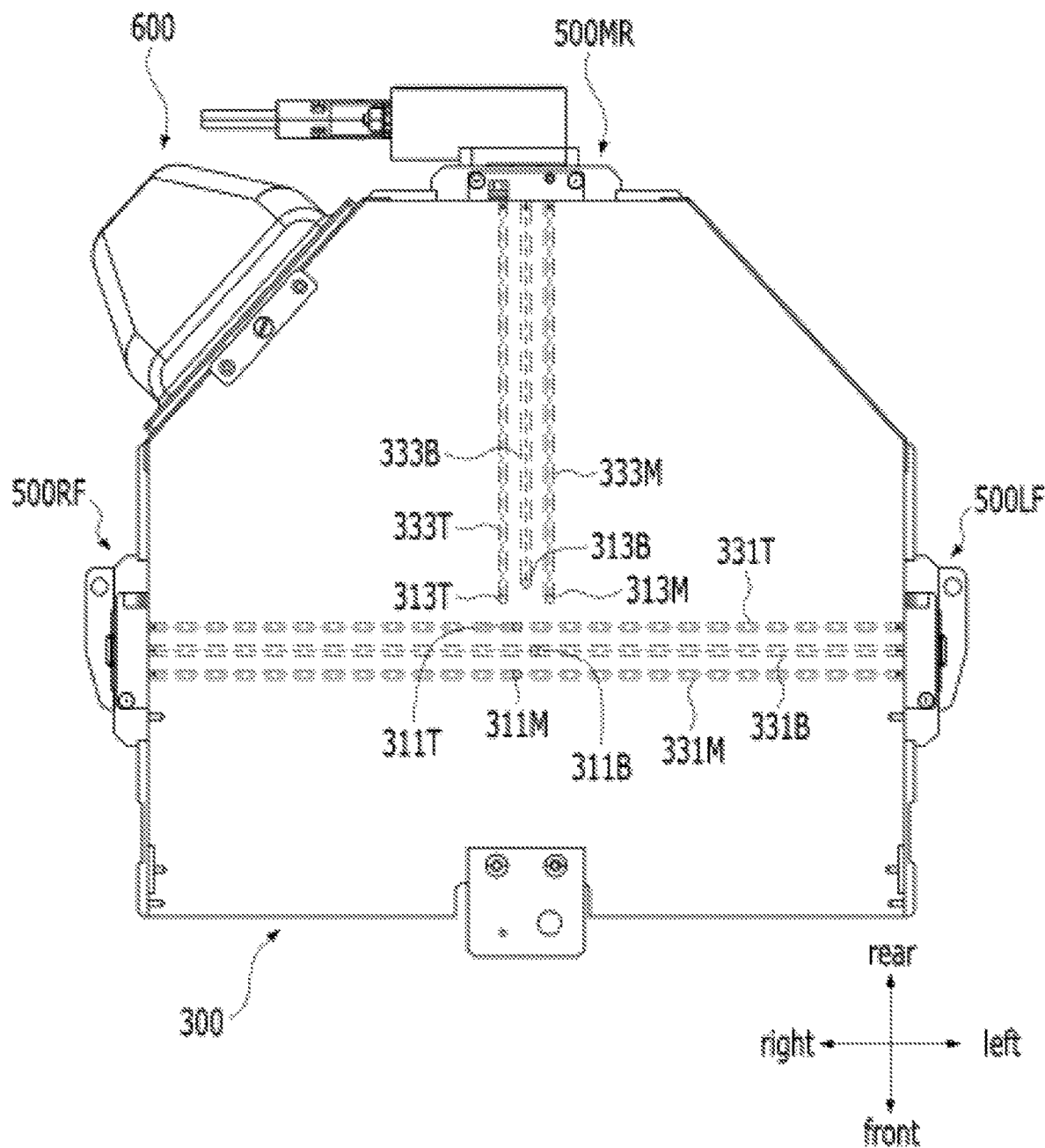
FIG. 4 is a view showing flow of purge gas flowing from a lower plate to injection members of FIG. 1.
Figure 5:
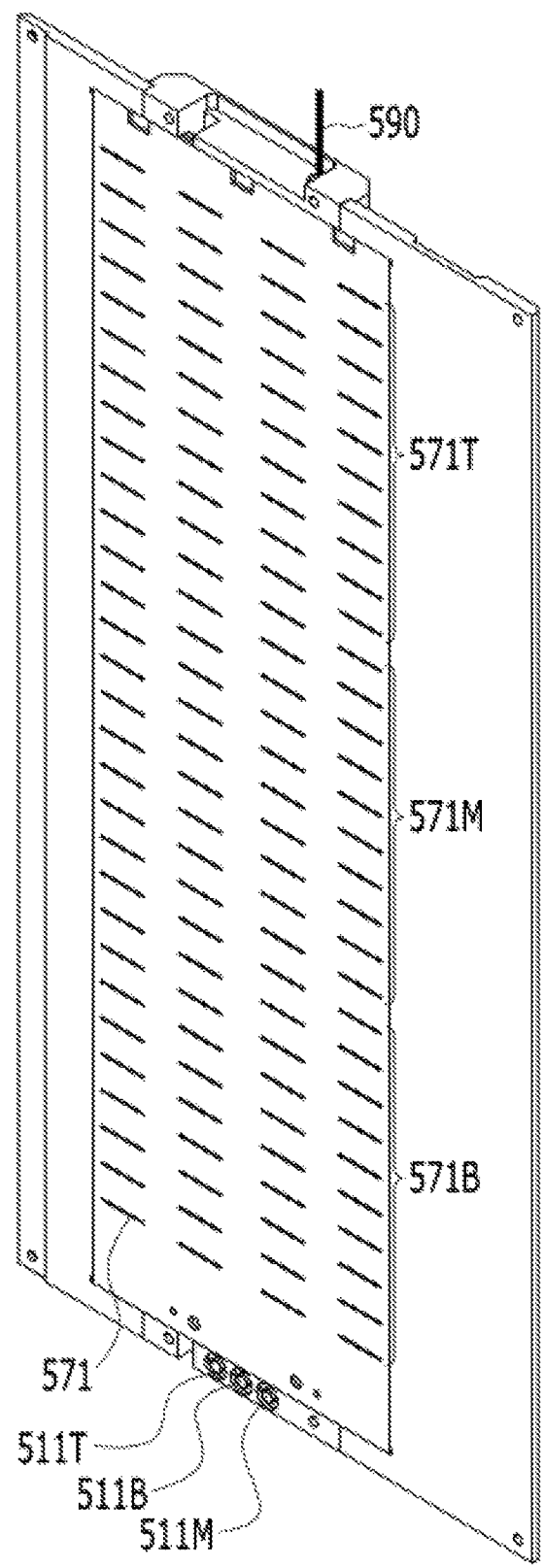
FIG. 5 is a perspective view showing a left front injection member of FIG. 1.
Figure 6:
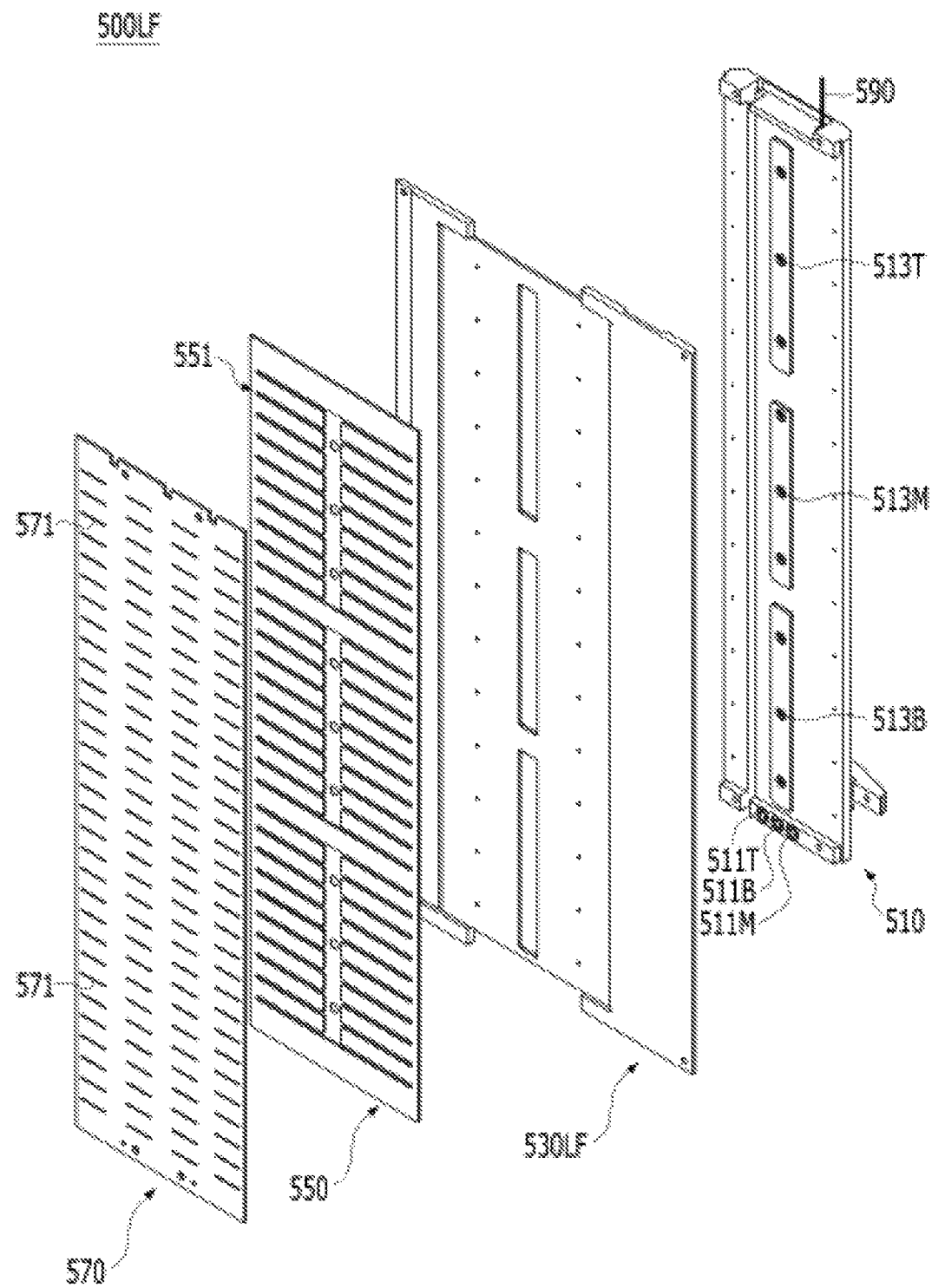
FIG. 6 is an exploded perspective view of FIG. 5.
Figure 7:
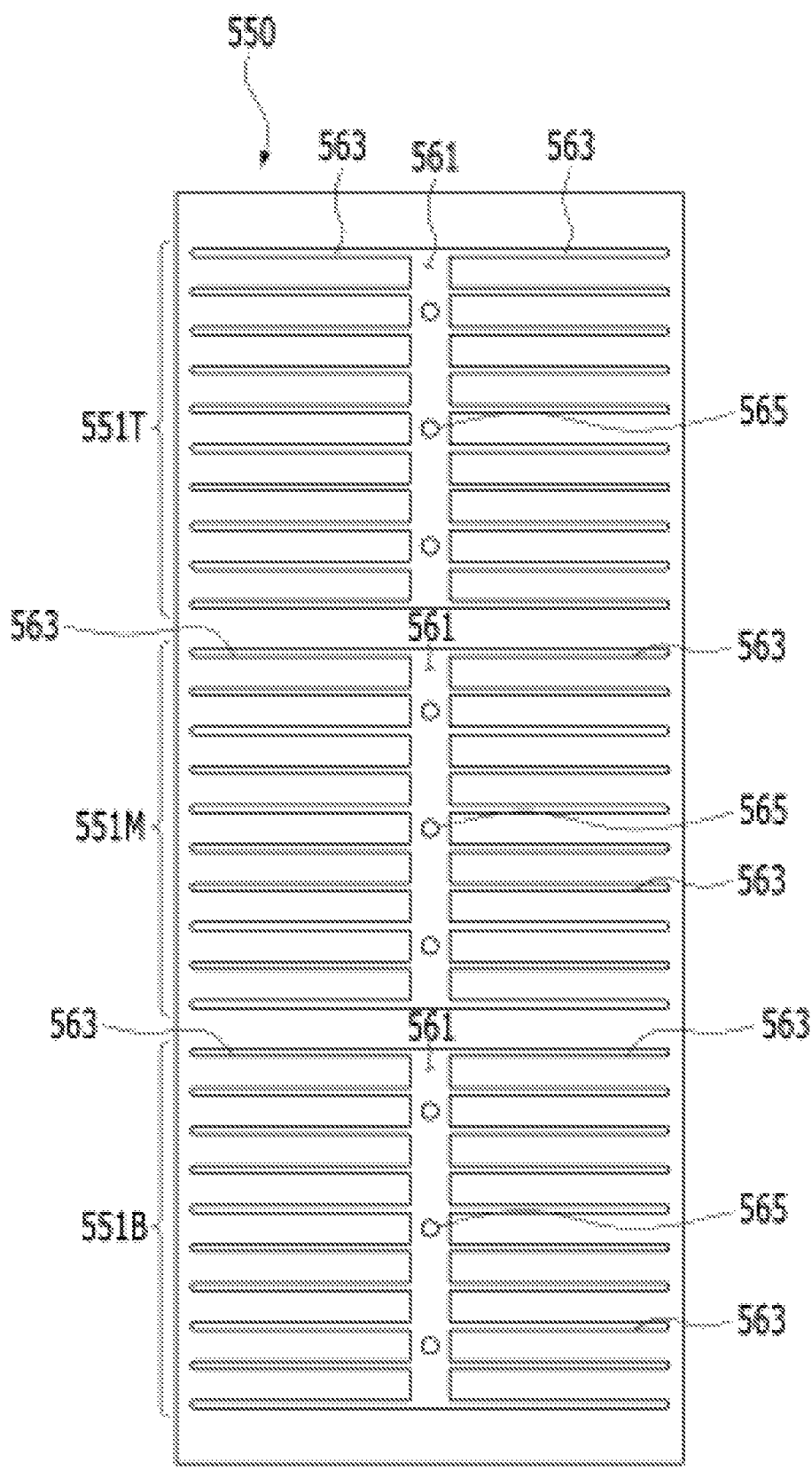
FIG. 7 is a view showing a branch passage portion plate of FIG. 6.
Figure 8:
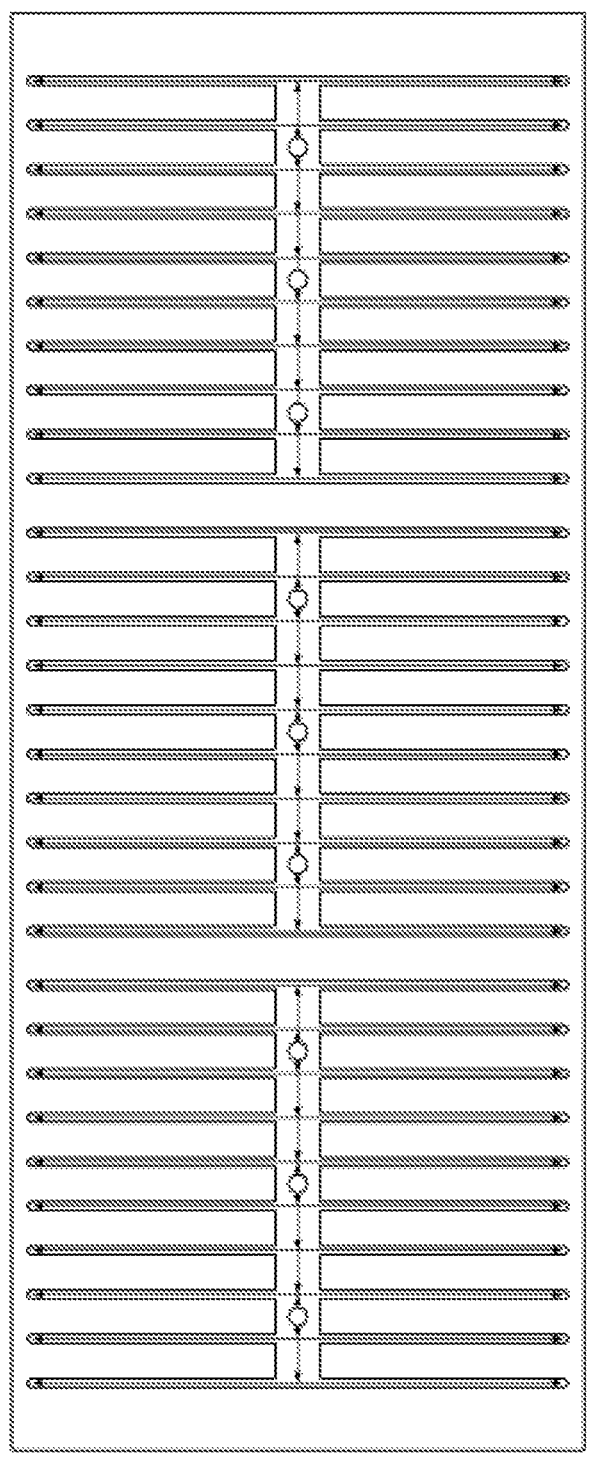
FIG. 8 is a view showing flow of the purge gas flowing through the branch passage portion plate of FIG. 7.
Figure 9:
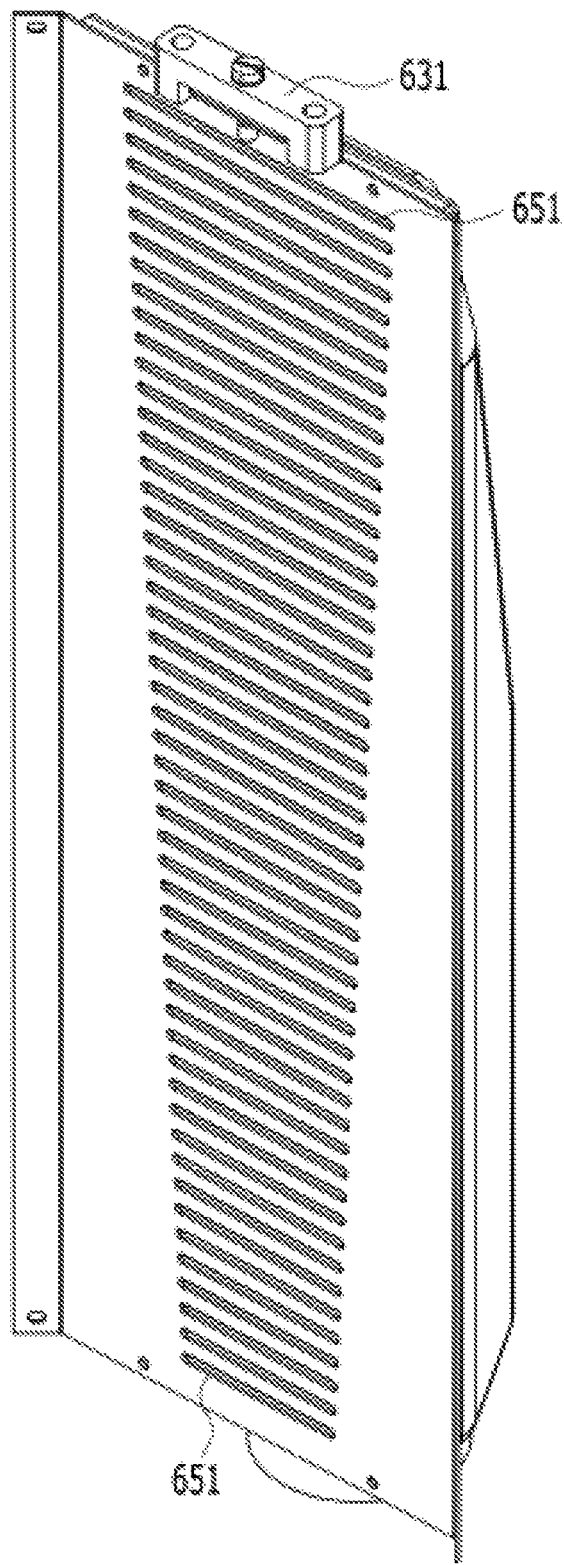
FIG. 9 is a perspective view showing an exhaust member of FIG. 1.
Figure 10:
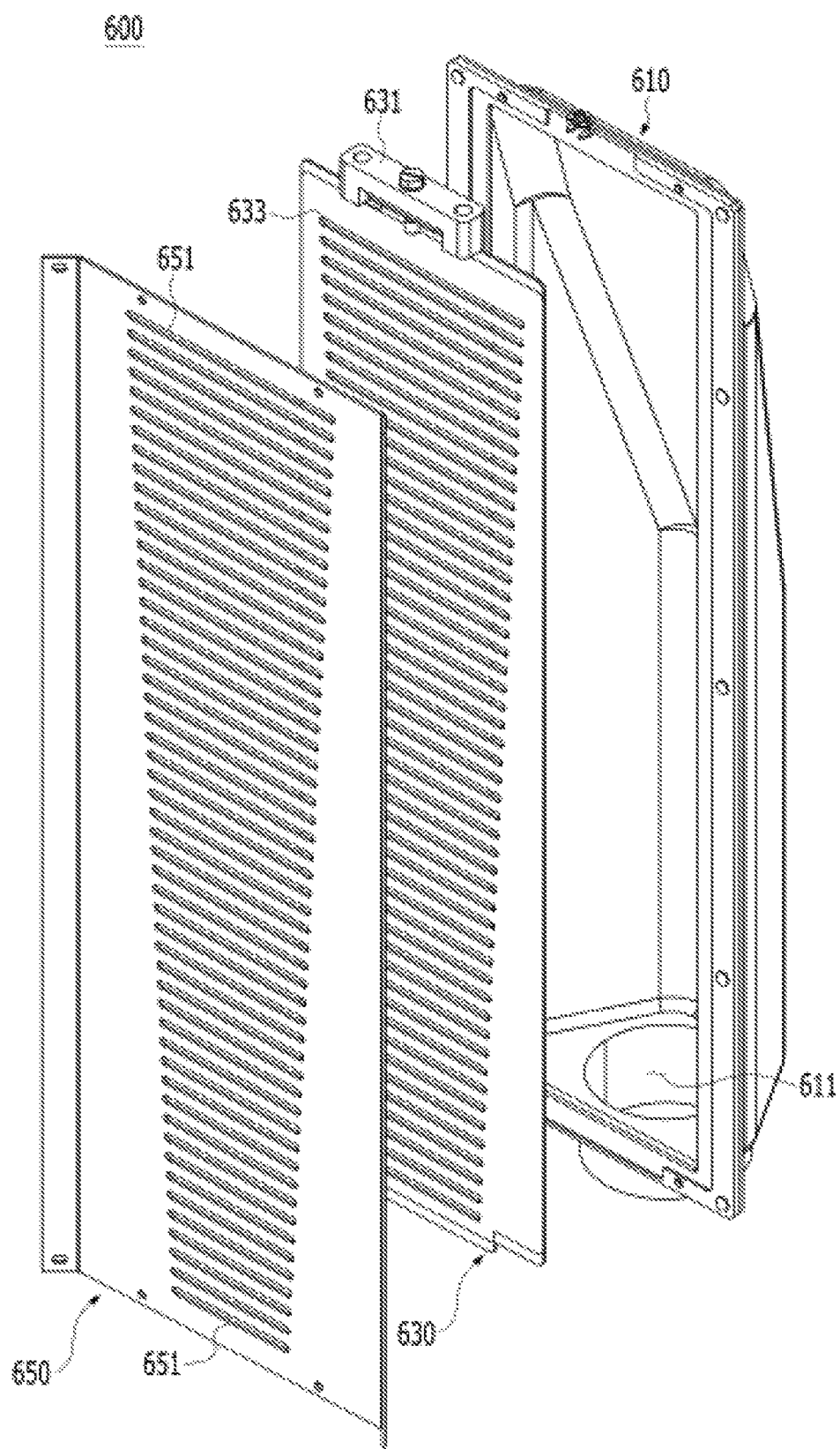
FIG. 10 is an exploded perspective view of FIG. 9.
Figure 11:
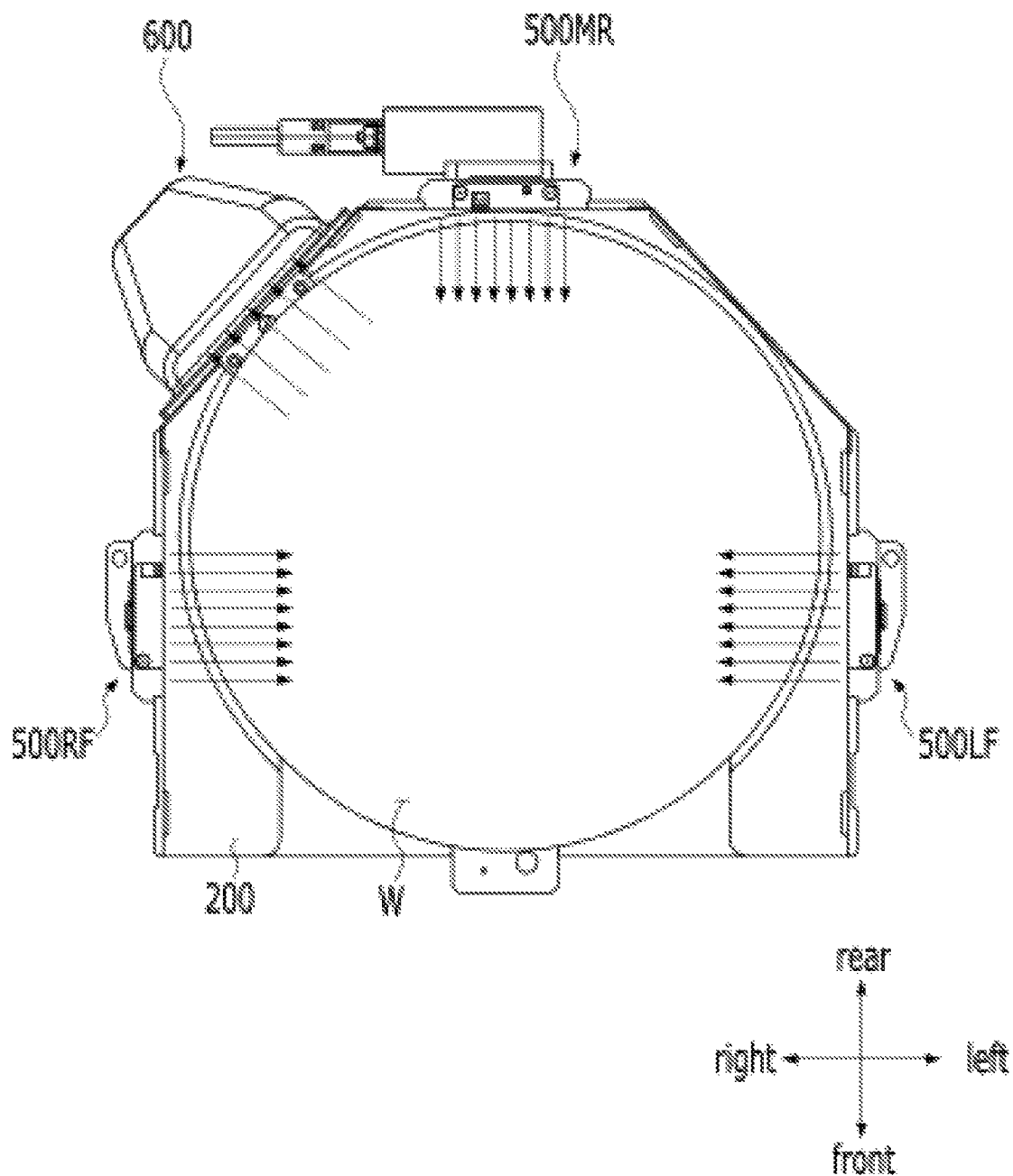
FIG. 11 is a view showing flow of the purge gas injected onto a wafer supported on a support of FIG. 1 and flow of the purge gas and fumes that are exhausted to the exhaust member.

FIG. 1 is a perspective view showing a wafer storage container according to a preferable embodiment of the present invention, FIG. 2 is an exploded perspective view of FIG. 1, FIG. 3 is a bottom view of FIG. 1, FIG. 4 is a view showing flow of purge gas flowing from a lower plate to injection members of FIG. 1, FIG. 5 is a perspective view showing a left front injection member of FIG. 1, FIG. 6 is an exploded perspective view of FIG. 5, FIG. 7 is a view showing a branch passage portion plate of FIG. 6, FIG. 8 is a view showing flow of the purge gas flowing through the branch passage portion plate of FIG. 7, FIG. 9 is a perspective view showing an exhaust member of FIG. 1, FIG. 10 is an exploded perspective view of FIG. 9, and FIG. 11 is a view showing flow of the purge gas injected onto a wafer supported on a support of FIG. 1 and flow of the purge gas and fumes that are exhausted to the exhaust member.

As shown in FIGS. 1 to 3, the wafer storage container 10 according to the preferable embodiment of the present invention includes: a storage chamber 100 (see FIG. 1) in which a wafer W received through a front opening 110 is stored; a support 200 provided in the storage chamber 100 and supporting the wafer W; a lower plate 300 forming the lower surface of the wafer storage container 10; an upper plate 400 forming the upper surface of the wafer storage container 10; a left front injection member 500LF disposed on the left front surface of the circumferential surface of the storage chamber 100 and injecting the purge gas into the storage chamber 100; a right front injection member 500RF disposed on the right front surface of the circumferential surface of the storage chamber 100 and injecting the purge gas into the storage chamber 100; a middle rear injection member 500MR disposed on the middle rear surface of the circumferential surface of the storage chamber 100 and injecting the purge gas into the storage chamber 100; and an exhaust member 600 disposed on the right rear surface of the circumferential surface of the storage chamber 100 where no injection member 500 is disposed and exhausting the purge gas in the storage chamber 100 and the fumes on the wafer W.

A Storage Chamber 100

Hereinafter, the storage chamber 100 will be described.

As shown in FIGS. 1 and 11, the storage chamber 100 functions to store the wafer W therein and is defined as an internal space surrounded by the circumferential surface having the left front injection member 500LF, the right front injection member 500RF, the middle rear injection member 500MR, a left rear wall 130LR (130 left rear), and the exhaust member 600 disposed thereon.

The front opening 110 is formed in the front surface of the storage chamber 100, and entrance and exit of the wafer W are allowed through the front opening 110.

The upper surface of the storage chamber 100 is formed of the upper plate 400 and the lower surface of the storage chamber 100 is formed of the lower plate 300. The circumferential surface of the storage chamber 100 is formed of the left front surface, the left rear surface, the middle rear surface, the right rear surface, and the right front surface in an order from left to right.

In this case, the left front injection member 500LF is disposed on the left front surface, the left rear wall 130LR is disposed on the left rear surface, the middle rear injection member 500MR is disposed on the middle rear surface, the exhaust member 600 is disposed on the right rear surface, and the right front injection member 500RF is disposed on the right front surface.

Thus, except for the front surface having the front opening 110 formed thereon, the upper, lower, circumferential surfaces of the storage chamber 100 are closed by the upper plate 400, the lower plate 300, the left front injection member 500LF, the right rear injection member 500, the middle rear injection member 500MR, the left rear wall 130LR, and the exhaust member 600.

Thus, as shown in FIG. 11, the purge gas is injected into the storage chamber 100 from the left front, right front, and middle rear surfaces of the storage chamber 100 where the left front injection member 500LF, the right rear injection member 500, and the middle rear injection member 500MR are disposed, and the purge gas having been injected into the storage chamber 100 and the fumes on the wafer W are exhausted through the exhaust member 600 disposed on the right rear surface.

A Support 200

As shown in FIGS. 1, 2, and 11, the support 200 supporting the wafer W is provided in the storage chamber 100.

Multiple supports 200 are provided in a vertical direction according to the number of wafers W stored in the storage chamber 100.

For example, in a case where thirty wafers W are stored in the storage chamber 100, thirty supports 200 are provided to respectively support the thirty wafers W.

The multiple supports 200 as described above are fixedly coupled to the left front, left rear, right front, and right rear surfaces of the storage chamber 100 by the support coupling portions 210.

Furthermore, the support 200 is provided with a step 230 stepped downwardly to partially overlap a circumferential edge portion of the wafer W, and three protruding pins 250 are provided at the step 230. Accordingly, the wafer W is supported on the support 200 in a state of being placed on the protruding pins 250.

As described above, the wafer W is supported on the support 200 in a state of being placed on the protruding pins 250, whereby a contact area between the wafer W and the support table 200 can be minimized and thus breakage of the wafer W due to contact can be minimized.

A Lower Plate 300 and an Upper Plate 400

Hereinafter, the lower plate 300 and the upper plate 400 will be described.

As shown in FIGS. 1 to 4, the lower plate 300 forms the lower surface of the wafer storage container 10 and functions to close a lower portion of the storage chamber 100 and to allow the purge gas supplied from the outside of the wafer storage container 10 to flow to the left front injection member 500LF, the right rear injection member 500, and the middle rear injection member 500MR through the supply hole formed in a lower surface of the lower plate 300, that is, a bottom surface thereof, and through the supply passage formed in the lower plate 300.

The supply hole 311 functions to allow the purge gas supplied from the outside of the wafer storage container 10 to flow into the lower plate 300.

The supply hole 311 is formed on the lower surface of the lower plate 300, that is, the bottom surface of the lower plate 300, and is configured with a left and right side-bottom region supply hole 311B, a left and right side-middle region supply hole 311M, a left and right side-top region supply hole 311T, a rear side-bottom region supply hole 313B, a rear side-middle region supply hole 313M, and a rear top region supply hole 313T depending on which region of a vertical direction region area in the storage chamber 100, that is, a bottom region, a middle region, a top region is supplied with the purge gas.

The supply passage 331 communicates with the supply hole 311 and functions as a passage that allows the purge gas supplied from the outside of the wafer storage container 10, that is, the purge gas supplied from an external supply part (not shown) to flow to the injection member 500.

The supply passage 331 is configured with: a left and right side-bottom region supply passage 331B communicating with the left and right side-bottom region supply hole 311B, the left and right side-middle region supply hole 311M, and the left and right side-top region supply hole 311T and allowing the purge gas to flow to the left front injection member 500LF and the right front injection member 500RF; a rear side-bottom region supply passage 333B communicating with the left and right side-middle region supply passage 331M, the left and right side-top region supply passage 331T, the rear side-bottom region supply hole 313B, the rear side-middle region supply hole 313M, and the rear top region supply hole 313T and allowing the purge gas to flow to the rear front injection member 500; a rear side-middle region supply passage 333M; and a rear side-top region supply passage 333T.

In this case, the left and right side-bottom region supply passage 331B has first and second ends respectively communicating with a bottom region communication hole 511B of the left front injection member 500LF and a bottom region communication hole 511B of the right front injection member 500RF, the left and right side-middle region supply passage 331M has first and second ends respectively communicating with a middle region communication hole 511M of the left front injection member 500LF and a middle region communication hole 511M of the right front injection member 500RF, and the left and right side-top region supply passage 331T has first and second ends respectively communicating with a top region communication hole 511T of left front injection member 500LF and a top region communication hole 511T of the right front injection member 500RF.

Furthermore, the rear side-bottom region supply passage 333B has an end communicating with the bottom region communication hole 511B of the middle rear injection member 500MR, the rear side-middle region supply passage 333M has an end communicating with the middle region communication hole 511M of the middle rear injection member 500MR, and rear side-top region supply passage 333T has an end communicating with the top region communication hole 511T of the middle rear injection member 500MR.

As shown in FIGS. 1 and 2, the upper plate 400 forms the upper surface of the wafer storage container 10 and functions to close an upper portion of the storage chamber 100. In this case, it is preferable that the overall shape of the upper plate 400 is the same as the overall shape of the lower plate 300.

An Injection Member 500

As shown in FIGS. 1 to 4 and FIG. 11, the injection member 500 is configured with the left front injection member 500LF disposed on the left front surface of the circumferential surface of the storage chamber 100, the right front injection member 500RF disposed on the right front surface of the circumferential surface of the storage chamber 100, and the middle rear injection member 500MR disposed on the middle rear surface of the circumferential surface of the storage chamber 100.

As shown in FIGS. 5 to 8, the left front injection member 500LF includes an inflow plate 510 having a communication hole 511 and an inflow hole 513 that communicate with the supply passage of the lower plate 300, a left front wall 530LF coupled with the inflow plate 510 and forming the left front surface of the storage chamber 100, a branch passage portion plate 550 coupled with the left front wall 530LF and having a branch passage portion 551 communicating with the inflow hole, an injection hole plate 570 coupled with the branch passage portion plate 550 and having multiple injection holes 571 communicating with the branch passage portion 551, and a heater rod 590 provided in the inflow plate 510.

The communication hole 511 communicating with the supply passage 331 of the lower plate 300 is formed in a lower portion of the inflow plate 510.

The communication hole 511 is configured with the bottom region communication hole 511B communicating with the first end of the left and right side-bottom region supply passage 331B of the lower plate 300, the middle region communication hole 511M communicating with the first end of the middle region supply passage 331M, and the top region communication hole 511T communicating with the first end of the left and right side-top region supply passage 331T.

Furthermore, the inflow hole 513 communicating with the branch passage portion 551 of the branch passage portion plate 550 is formed in the inflow plate 510.

The inflow hole 513 is configured with a bottom region inflow hole 513B communicating with the bottom region communication hole 511B, a middle region inflow hole 513M communicating with the middle region communication hole 511M, and a top region inflow hole 513T communicating with the top region communication hole 511T.

In this case, each communication hole 511 and each inflow hole 513 communicate with each other by an internal passage (not shown) provided in the inflow plate 510.

Furthermore, the bottom region inflow hole 513B, the middle region inflow hole 513M, and the top region inflow hole 513T are each configured with three inflow holes 513.

The left front wall 530LF is coupled with the inflow plate 510 in the front direction thereof (right direction in FIGS. 1 and 2) to be interposed between the inflow plate 510 and the branch passage portion plate 550, and is a wall forming the left front surface of the circumferential surface of the storage chamber 100.

The inflow plate 510, the branch passage portion plate 550, and the injection hole plate 570 are coupled to the left front wall 530LF, whereby the left front injection member 500LF can be easily disposed on the left front surface of the storage chamber 100.

In addition, such above-described engagement structure enables that in a case where the wafer storage container 10 is used for a long period of time and thus contaminants such as fumes on the wafer W, etc. accumulate on the left front injection member 500LF, the left front injection member 500LF is removed for replacement, thus prolonging a life span of the wafer storage container 10.

Moreover, in a case where contaminants accumulate in the passages of the left front injection member 500LF rather than the left front wall 530LF, the inflow plate 510, the branch passage portion plate 550, and the injection hole plate 570 may be removed for replacement except for the left front wall 530LF. As such, the engagement and disengagement structure of the left front wall 530LF enables easy replacement of only the components desired to be replaced.

Of course, the above-described engagement and disengagement structure may be applied to the right front injection member 500RF and the middle rear injection member 500MR.

In this case, as required, the right front injection member 500RF itself may be replaced, or the inflow plate 510, the branch passage portion plate 550, and the injection hole plate 570 may be removed for replacement except for a right front wall 530RF.

Furthermore, as required, in the case of the middle rear injection member 500MR, the middle rear injection member 500MR itself may be replaced, or the inflow plate 510, the inflow plate 510, the branch passage portion plate 550, and the injection hole plate 570 may be removed for replacement.

The branch passage portion plate 550 is coupled to the left front wall 530LF in the front direction thereof (right direction in FIGS. 1 and 2) to be interposed between the left front wall 530LF and the injection hole plate 570. The branch passage portion plate 550 has the branch passage portion 551 communicating with the inflow hole 513 of the inflow plate 510.

The branch passage portion 551 communicates with the inflow hole 513 of the inflow plate 510 as described above and may have three regions: a bottom region branch passage portion 551B, a middle region branch passage portion 551M, and a top region branch passage portion 551T.

Furthermore, the bottom region branch passage portion 551B, the middle region branch passage portion 551M, and the top region branch passage portion 551T are each includes a main passage 561 communicating with the inflow hole 513 of the inflow plate 510, and a branch passage 563 the multiple injection holes 571 of the injection hole plate 570.

Three holes 565 are formed in the main passage 561 of each of the bottom region branch passage portion 551B, the middle region branch passage portion 551M, and the top region branch passage portion 551T. The three holes 565 respectively communicate with the three regions that are the bottom region inflow hole 513B, the middle region inflow hole 513M, and the top region inflow hole 513T.

In this case, it is preferable that at least one of the three holes 565 is formed to be positioned at a center of a vertical length of the main passage 561. This is because when the hole 565 is positioned at the center of the vertical length of the main passage 561, the purge gas flowing along the main passage 561 through the centrally positioned hole 565 flows in an upward or downward direction to have the same flow distance in the upward and downward directions. Accordingly, unlike the above, even when only one hole 565 is formed in the main passage 561, a uniform flow of the purge gas can be ensured to a certain extent (however, there may be a difference in flow rate, a difference in injection speed, etc. depending on a difference in the flow distance of the purge gas).

The branch passage 563 is configured such that branch passages are branched symmetrically with each other with respect to the main passage 561 to form a branch section. Multiple branch passages 563 are provided such that each of the multiple injection holes 571 of the injection hole plate 570 communicates with the main passage 561.

The injection hole plate 570 is coupled to the branch passage portion plate 550 in the front direction (right direction in FIGS. 1 and 2). The injection hole plate 570 has the multiple injection holes 571 of the injection hole plate 570 communicating with the multiple branch passages 563. In this case, the multiple injection holes 571 have multiple rows and columns (thirty rows and four columns, a total of one hundred twenty injection holes 571 are shown in FIGS. 5 and 6). In an order from the bottom to the top, the thirty rows may be configured such that first to tenth rows form a lower region injection holes 571B, eleventh to twentieth rows form a middle region injection hole 571M, and twenty first to thirtieth rows form a top region injection hole 571T.

The multiple injection holes 571 function as holes through which the purge gas having flowed through the branch passage 563 is injected into the storage chamber 100. As described above, in a case where the multiple injection holes 571 have the thirty rows, the purge gas is injected onto an upper surface of each of the thirty wafers W, thus achieving fume removal and moisture control of the wafer W.

The main passage 561 of the branch passage portion plate 550 is formed in a vertical direction of a surface parallel to a portion of the circumferential surface of the storage chamber 100 where the injection member 500 is disposed.

Referring to the left front injection member 500LF, the portion of the circumferential surface of the storage chamber 100 may be defined as the left front surface having the left front injection member 500LF disposed thereon, and the surface parallel to the portion of the circumferential surface of the storage chamber may be defined as a front surface (right surface in FIGS. 1 and 2) of the branch passage portion plate 550 in which the main passage 561 is formed.

For example, assuming that a front surface of the injection hole plate 570, the front surface being the innermost surface of the left front injection member 500LF, is the left front surface, the front surface of the branch passage portion plate 550 is a surface parallel outwardly to the front surface of the injection hole plate 570. Thus, the front surface of the branch passage portion plate 550 in which the main passage 561 is formed is defined as the surface parallel to the portion of the circumferential surface of the storage chamber.

Accordingly, the main passage 561 of the branch passage portion 551 formed in the branch passage portion plate 550 of the right front injection member 500RF may be formed in a vertical direction of a surface parallel to the right front surface of the circumferential surface of the storage chamber 100, and the main passage 561 of the branch passage portion 551 formed in the branch passage portion plate 550 of the middle rear injection member 500MR may be formed in a vertical direction of a surface parallel to the middle rear surface of the circumferential surface of the storage chamber 100.

As described above, the main passage 561 of the branch passage portion plate 550 of the injection member 500 is formed in the vertical direction to the surface parallel to the portion of the circumferential surface of the storage chamber 100 where the injection member 500 is disposed, whereby the branch passage portion plate 550 has a small thickness, thus achieving a size reduction of the injection member 500 and of the wafer storage container 10.

More specifically, the wafer W supported by the support 200 is supported in a vertical direction in a stacked manner, and the shape of the branch passage portion 551, which includes the main passage 561 of the branch passage portion plate 550 of the injection member 500, etc., enables that, unlike a wafer storage container in the related art, the purge gas can be efficiently supplied from the bottom to the top through the injection member 500, that is, the size-reduced injection member 500, thus achieving purge gas injection into the storage chamber 100.

Furthermore, the above concept is also applicable to a case where each injection member 500, that is, the left front injection member 500LF, the right front injection member 500RF, and the middle rear injection member 500MR have a curved shape rather than having a planar shape shown in FIGS. 5 to 8. This is because even when a portion of the circumferential surface of the storage chamber where the left front injection member is disposed, that is, the circumferential surface of the storage chamber is formed into a curved shape similar to a circle and the left front surface of the circumferential surface of the storage chamber has a curved shape, a surface parallel to the left front surface corresponds to the curved left front surface the curved-shaped front surface of the branch passage portion plate (that is, even in the case of a curved shape, the surface parallel to the left front surface or parallel to the front surface of the injection hole plate may correspond to the front surface of the branch passage portion plate).

Due to the above structure, the main passage 561 of each injection member 500, that is, each of the left front injection member 500LF, the right front injection member 500RF, and the middle rear injection member 500MR is formed in the branch passage portion plate 550 of each of the left front injection member 500LF, the right front injection member 500RF so as to be parallel to a direction in which the wafer W is stored in the storage chamber 100, that is, the vertical direction.

The branch passage 563 of the branch passage portion plate 550 is branched from the main passage 561 at a right angle, that is, an angle of 90°. Accordingly, the branch passage 563 can be said to be formed in a horizontal direction of the surface parallel to the portion of the circumferential surface of the storage chamber 100 where the injection member 500 is disposed.

As described above, the main passage 561 is formed in the vertical direction of the surface parallel to the portion of the circumferential surface of the storage chamber 100 where the injection member 500 is disposed while the branch passage 563 is branched from the main passage 561 at a right angle, that is, an angle of 90°. Thus, it is noted that the branch passage 563 can be said to be formed in the horizontal direction of the surface parallel to the portion of the circumferential surface of the storage chamber 100 where the injection member 500 is disposed.

The heater rod 590 is inserted into the inflow plate 510 and functions to heat and raise the temperature of the purge gas flowing through the internal passage of the inflow plate 510 and to heat and raise the temperature of the inside of the storage chamber 100.

In other words, since the heater rod 590 is inserted into the inflow plate 510 so as to be close to the internal passage of the inflow plate 510, when the heater rod 590 emits heat, the purge gas flowing through the internal passage is heated. Accordingly, as the purge gas that is an inert gas is heated, the flow of the purge gas becomes more active and thus can be efficiently injected into the storage chamber 100.

In addition, when the heater rod 590 emits heat, the injection member 500 itself is heated so that heat is transmitted into the storage chamber 100 to raise the temperature of the inside of the storage chamber 100. Accordingly, as the temperature of the inside of the storage chamber 100 increases, dehumidification of air in the storage chamber 100 to lower humidity can be achieved. As a result, dehumidification in the wafer storage container 10 as well as purging with the purge gas can be achieved.

The right front injection member 500RF includes an inflow plate 510 having a communication hole 511 and an inflow hole 513 that communicate with the supply passage 331 of the lower plate 300, a right front wall 530RF coupled with the inflow plate 510 and forming the right front surface of the circumferential surface of the storage chamber 100, a branch passage portion plate 550 coupled with the right front wall 530RF and having a branch passage portion 551 communicating with the inflow hole 513, an injection hole plate 570 coupled with the branch passage portion plate 550 and having multiple injection holes 571 communicating with the branch passage portion 551, and a heater rod 590 provided in the inflow plate 510.

Furthermore, the middle rear injection member 500MR includes an inflow plate 510 having a communication hole 511 and an inflow hole 513 that communicate with the supply passage 331 of the lower plate 300, a middle rear wall 530MR coupled with the inflow plate 510 and forming the middle rear surface of the circumferential surface of the storage chamber 100, a branch passage portion plate 550 coupled with the middle rear wall 530MR and having a branch passage portion 551 communicating with the inflow hole 513, an injection hole plate 570 coupled with the branch passage portion plate 550 and having multiple injection holes 571 communicating with the branch passage portion 551, and a heater rod 590 provided in the inflow plate 510.

In other words, the right front injection member 500RF and the middle rear injection member 500MR differ from the left front injection member 500LF in that the disposition positions thereof are different from the disposition of the left front injection member, and in that the right front injection member and the middle rear injection member are respectively provided with the right front wall 530RF and the middle rear wall 530MR. However, the right front injection member and the middle rear injection member have the same configuration as the left front injection member 500LF.

An Exhaust Member 600

Hereinafter, the exhaust member 600 will be described.

As shown in FIG. 1, FIG. 2, and FIGS. 9 to 11, the exhaust member 600 is disposed on the right rear surface of the circumferential surface of the storage chamber 100 where no injection member 500 is disposed, and includes an exhaust hopper 610 having an exhaust outlet 611, an exhaust hole plate 650 coupled to the exhaust hopper 610 and having multiple exhaust holes 651 communicating with the exhaust outlet 611, and a blocking plate 630 interposed between the exhaust hopper 610 and the exhaust plate 650 and blocking the exhaust member 600 from exhausting the purge gas and exhausting the fumes on the wafer W.

The exhaust outlet 611 is formed in the bottom of the exhaust hopper 610, that is, the exhaust hopper 610 so as to communicate with an external exhaust part (not shown) of the wafer storage container 10.

The exhaust hole plate 650 is coupled to the exhaust hopper 610 in the front direction thereof (left direction in FIGS. 1 and 2) and has the multiple exhaust holes 651 communicating with the exhaust outlet 611.

In this case, the multiple exhaust holes 651 may be configured such that the exhaust holes gradually increase in opening area upwards from a lower portion of the exhaust hole plate 650 to an upper portion thereof. Accordingly, the fumes on the wafer W and the purge gas can be efficiently exhausted through the upper exhaust holes 651 that are relatively far from the exhaust outlet 611.

The blocking plate 630 is interposed between the exhaust hopper 610 and the exhaust hole plate 650 and has multiple exhaust communication holes 633 corresponding to the multiple exhaust holes 651 of the exhaust hole plate 650.

The blocking plate 630 and the exhaust hopper 610 are connected to each other by an actuating portion 631, and the actuating portion 631 functions to move the blocking plate 630 upwards and downwards.

Due to the above configuration, the blocking plate 630 moves upwards and downwards relative to the exhaust hopper 610 and the exhaust hole plate 650 in accordance with operation of the driving actuating portion 631, and thus blocks exhaust of the exhaust member 600.

In detail, when the blocking plate 630 is in a correct position, that is, in a downwardly moved position, the multiple exhaust holes 651 of the exhaust hole plate 650 and the multiple exhaust communication hole 633 of the blocking plate 630 are allowed to communicate with each other. This is because the multiple exhaust communication holes 633 are formed in a shape corresponding to the multiple exhaust holes 651.

Accordingly, in a case where the blocking plate 630 is in the correct position, when a fan, etc. of the external exhaust part is operated to generate a suction force, the purge gas in the storage chamber 100 and the fumes on the wafer W are exhausted to the external exhaust part through the multiple exhaust holes 651, the multiple exhaust communication holes 633, and the exhaust outlet 611.

However, when the blocking plate 630 is in a blocking position, that is, in an upwardly moved position, the multiple exhaust holes 651 and the multiple exhaust communication holes 633 are blocked from communicating with each other. This is because regions of a front surface of the blocking plate 630 where no exhaust communication hole 633 is formed (i.e., respective regions between the multiple exhaust communication holes 633) close the multiple exhaust holes 651, thus blocking the communication between the multiple exhaust holes 651 and the multiple exhaust communication holes 633.

Thus, even when the fan, etc. of the external exhaust part is operated to generate the suction force, the purge gas in the storage chamber 100 and the fumes on the wafer W are blocked by the regions of the front surface of the blocking plate 630 where no exhaust communication hole 633 is formed, and thus are blocked from being exhausted.

As described above, the blocking plate 630 blocks exhaust of the exhaust member 600 and thus provides the following advantages.

In a case where without provision of the blocking plate 630, exhaust of the exhaust member 600 is enabled to be selectively controlled by controlling a valve, etc. provided at a communication portion and at the external exhaust part, air in the storage chamber 100 may be mixed with polluting gas such as fumes on the wafer W.

In detail, when exhaust of the exhaust member 600 is stopped by closing the valve in a state in which exhaust of the exhaust member 600 is performed by operation of the fan, etc. of the external exhaust part, the fumes on the wafer W and the purge gas are isolated in a space where the exhaust outlet 611 and the external exhaust part are in communication (i.e., a part of a communication path between the exhaust outlet 611 and the external exhaust part, the part of the communication path being defined to the valve).

Accordingly, the fumes on the wafer W and the purge gas isolated in the space are mixed with the purge gas injected from the injection member 500 until exhaust of the exhaust member 600 is performed again by switching the valve to an open state, resulting in a risk that the inside of the storage chamber 100 is contaminated.

In addition, because the fumes on the wafer W, that is, the polluting gas, stays in the space, the space tends to be contaminated and thus the entire exhaust line may have to be replaced. However, when the exhaust member 600 is provided with the blocking plate 630 as described above, the blocking plate 630 blocks both the storage chamber 100 and the exhaust line. Thus, it is possible to prevent the residual polluting gas from being present in the space described above and to quickly block exhaust of the exhaust member 600.

The blocking plate 630 of the exhaust member 600 described above may block only partial areas of the exhaust holes 651 rather than completely blocking the exhaust holes 651 depending on a position the blocking plate.

In other words, when the blocking plate 630 is moved upwards to a position slightly lower than the above-mentioned upwardly moved position, the partial areas of the exhaust holes 651 are blocked by the regions of the front surface of the blocking plate 630 where no exhaust communication hole 633 is formed (i.e., the respective regions between the multiple exhaust communication holes 633), whereas remaining areas of the exhaust holes 651 are still in communication with the exhaust communication holes 633.

Accordingly, even though exhausting is performed by communication between the exhaust holes 651 and the exhaust communication holes 633, communication areas of the exhaust holes 651 decreases, and thus the exhaust member decreases in exhaust capability compared to a case when the exhaust holes 651 and the exhaust communication holes 633 are in full communication with each other.

As described above, the blocking plate 630 is adjusted in the upwardly moved position, that is, in upward height, whereby opening areas where the exhaust holes 651 and the exhaust communication holes 633 are in communication with each other, that is, opening areas of the exhaust holes 651 can be adjusted. Thus, the exhaust capability of the exhaust member 600 can be controlled to a desired level.

Of course, the exhaust member 600 described above may be disposed on the left rear surface of the circumferential surface of the storage chamber 100, depending on the application, size, etc. of the wafer storage container 10 as required.

In addition, in the above description, the blocking plate 630 of the exhaust member 600 is moved upwards and downwards by the actuating portion 631 to block exhaust of the exhaust member 600. However, exhaust of the exhaust member 600 may be blocked by a movement such as a horizontal sliding movement, rotation, etc. depending on the application, size, etc. of the wafer storage container 10 as required.

Moreover, the blocking plate 630 described above may be provided at a position behind a rear surface of the injection hole plate 570 of each of the right front injection member 500, the left front injection member 500LF, and the middle rear injection member 500MR and may block purge gas injection of the injection member 500 by the above-described configuration and function.

Flow of Purge Gas in a Wafer Storage Container 10

Hereinafter, the flow of the purge gas in the wafer storage container 10 having the above-described configuration will be described.

First, a description will be given of the flow of the purge gas, which is injected into the storage chamber 100 through the injection member 500, that is, the left front injection member 500LF, the right front injection member 500RF, and the middle rear injection member 500MR.

When the purge gas is supplied from the external supply part of the wafer storage container 10, the supplied purge gas flows into the lower plate 300 through the supply hole 311 of the lower plate 300.

In this case, as shown in FIG. 4, the purge gas having flowed to the left and right side-bottom region supply hole 311B of the supply hole 311 flows through the left and right side-bottom region supply passage 331B, and is divided to flow to the bottom region communication hole 511B of the inflow plate 510 of the left front injection member 500LF and to the bottom region communication hole 511B of the inflow plate 510 of the right front injection member 500RF.

Furthermore, the purge gas having flowed to the left and right side-middle region supply hole 311M of the supply hole 311 flows through the left and right side-middle region supply passage 331M, and is divided to flow to the middle region communication hole 511M of the inflow plate 510 of the left front injection member 500LF and to the middle region communication hole 511M of the inflow plate 510 of the right front injection member 500RF.

Furthermore, the purge gas having flowed to the left and right side-top region supply hole 311T of the supply hole 311 flows through the left and right side-top region supply passage 331T, and is divided to flow to the top region communication hole 511T of the inflow plate 510 of the left front injection member 500LF and to the top region communication hole 511T of the inflow plate 510 of the right front injection member 500RF.

The purge gas having flowed to the bottom region communication hole 511B of the inflow plate 510 of the left front injection member 500LF flows to the bottom region inflow hole 513B through the internal passage, and then, as shown in FIG. 8, flows to the main passage 561 of the bottom region branch passage portion 551B through the holes of the main passage 561 of the bottom region branch passage portion 551B of the branch passage portion 551 of the branch passage portion plate 550.

The purge gas having flowed to the main passage 561 of the bottom region branch passage portion 551B flows along the branch passages 563 branched from the main passage 561 of the bottom region branch passage portion 551B, and is then injected into the storage chamber 100 through the bottom region injection hole 571B of the injection holes 571 of the injection hole plate 570, the injection holes communicating with the branch passages 563.

Furthermore, the purge gas having flowed to the middle region communication hole 511M of the inflow plate 510 of the left front injection member 500LF flows to the middle region inflow hole 513M through the internal passage, and then, as shown in FIG. 8, flows to the main passage 561 of the middle region branch passage portion 551M through the holes of the main passage 561 of the middle region branch passage portion 551M of the branch passage portion 551 of the branch passage portion plate 550.

The purge gas having flowed to the main passage 561 of the middle region branch passage portion 551M flows along the branch passages 563 branched from the main passage 561 of the middle region branch passage portion 551M, and is then injected into the storage chamber 100 through the middle region injection hole 571M of the injection holes 571 of the injection hole plate 570, the injection holes communicating with the branch passages 563.

Furthermore, the purge gas having flowed to the top region communication hole 511T of the inflow plate 510 of the left front injection member 500LF flows to the top region inflow hole 513T through the internal passage, and then, as shown in FIG. 8, flows to the main passage 561 of the top region branch passage portion 551T through the holes of the main passage 561 of the top region branch passage portion 551T of the branch passage portion 551 of the branch passage portion plate 550.

The purge gas having flowed to the main passage 561 of the top region branch passage portion 551T flows along the branch passages 563 branched from the main passage 561 of the top region branch passage portion 551T, and is then injected into the storage chamber 100 through the top region injection hole 571T of the injection holes 571 of the injection hole plate 570, the injection holes communicating with the branch passages 563.

The flow of the purge gas in the left front injection member 500LF described above can also find application to the flow of purge gas in the right front injection member 500RF.

In other words, the purge gas having flowed to the bottom region communication hole 511B of the inflow plate 510 of the right front injection member 500RF flows to the bottom region inflow hole 513B through the internal passage, and then, as shown in FIG. 8, flows to the main passage 561 of the bottom region branch passage portion 551B through the holes of the main passage 561 of the bottom region branch passage portion 551B of the branch passage portion 551 of the branch passage portion plate 550.

The purge gas having flowed to the main passage 561 of the bottom region branch passage portion 551B flows along the branch passages 563 branched from the main passage 561 of the bottom region branch passage portion 551B, and is then injected into the storage chamber 100 through the bottom region injection hole 571B of the injection holes 571 of the injection hole plate 570, the injection holes communicating with the branch passages 563.

Furthermore, the purge gas having flowed to the middle region communication hole 511M of the inflow plate 510 of the right front injection member 500RF flows to the middle region inflow hole 513M through the internal passage, and then, as shown in FIG. 8, flows to the main passage 561 of the middle region branch passage portion 551M through the holes of the main passage 561 of the middle region branch passage portion 551M of the branch passage portion 551 of the branch passage portion plate 550.

The purge gas having flowed to the main passage 561 of the middle region branch passage portion 551M flows along the branch passages 563 branched from the main passage 561 of the middle region branch passage portion 551M, and is then injected into the storage chamber 100 through the middle region injection hole 571M of the injection holes 571 of the injection hole plate 570, the injection holes communicating with the branch passages 563.

Furthermore, the purge gas having flowed to the top region communication hole 511T of the inflow plate 510 of the right front injection member 500RF flows to the top region inflow hole 513T through the internal passage, and then, as shown in FIG. 8, flows to the main passage 561 of the top region branch passage portion 551T through the holes of the main passage 561 of the top region branch passage portion 551T of the branch passage portion 551 of the branch passage portion plate 550.

The purge gas having flowed to the main passage 561 of the top region branch passage portion 551T flows along the branch passages 563 branched from the main passage 561 of the top region branch passage portion 551T, and is then injected into the storage chamber 100 through the top region injection hole 571T of the injection holes 571 of the injection hole plate 570, the injection holes communicating with the branch passages 563.

Unlike the left front injection member 500LF and the right front injection member 500RF described above, in the case of the middle rear injection member 500MR, the purge gas inflows through the rear side-bottom region supply hole 313B, the rear side-middle region supply hole 313M, and the rear top region supply hole 313T of the supply hole 311 of the lower plate 300.

Accordingly, the purge gas having flowed to the rear side-bottom region supply hole 313B of the supply hole 311 of the lower plate 300 flows to the bottom region communication hole 511B of the inflow plate 510 of the middle rear injection member 500MR through the rear side-bottom region supply passage 333B. The purge gas having flowed to the rear side-middle region supply hole 313M of the supply hole 311 of the lower plate 30 flows to the middle region communication hole 511M of the inflow plate 510 of the middle rear injection member 500MR through rear side-middle region supply passage 333M. The purge gas having flowed to the rear top region supply hole 313T of the supply hole 311 of the lower plate 300 flows to the top region communication hole 511T of the inflow plate 510 of the middle rear injection member 500MR through the rear side-top region supply passage 333T.

The purge gas having flowed to the bottom region communication hole 511B of the inflow plate 510 of the middle rear injection member 500 flows to the bottom region inflow hole 513B through the internal passage, and then, as shown in FIG. 8, flows to the main passage 561 of the top region branch passage portion 551T through the holes of the main passage 561 of the bottom region branch passage portion 551B through the holes of the main passage 561 of the bottom region branch passage portion 551B of the branch passage portion 551 of the branch passage portion plate 550.

The purge gas having flowed to the main passage 561 of the bottom region branch passage portion 551B flows along the branch passages 563 branched from the main passage 561 of the bottom region branch passage portion 551B, and is then injected into the storage chamber 100 through the bottom region injection hole 571B of the injection holes 571 of the injection hole plate 570, the injection holes communicating with the branch passages 563.

Furthermore, the purge gas having flowed to the bottom region communication hole 511B of the inflow plate 510 of the middle rear injection member 500 flows to the middle region inflow hole 513M through the internal passage, and then, as shown in FIG. 8, flows to the main passage 561 of the middle region branch passage portion 551M through the holes of the main passage 561 of the bottom region branch passage portion 551B through the holes of the main passage 561 of the middle region branch passage portion 551M of the branch passage portion 551 of the branch passage portion plate 550.

The purge gas having flowed to the main passage 561 of the middle region branch passage portion 551M flows along the branch passages 563 branched from the main passage 561 of the middle region branch passage portion 551M, and is then injected into the storage chamber 100 through the middle region injection hole 571M of the injection holes 571 of the injection hole plate 570, the injection holes communicating with the branch passages 563.

Furthermore, the purge gas having flowed to the top region communication hole 511T of the inflow plate 510 of the middle rear injection member 500 flows to the top region inflow hole 513T through the internal passage, and then, as shown in FIG. 8, flows to the main passage 561 of the top region branch passage portion 551T through the holes of the main passage 561 of the top region branch passage portion 551T through the holes of the main passage 561 of the top region branch passage portion 551T of the branch passage portion 551 of the branch passage portion plate 550.

The purge gas having flowed to the main passage 561 of the top region communication hole 511T flows along the branch passages 563 branched from the main passage 561 of the top region communication hole 511T, and is then injected into the storage chamber 100 through the top region injection hole 571T of the injection holes 571 of the injection hole plate 570, the injection holes communicating with the branch passages 563.

The purge gas having flowed to each of the left front injection member 500LF, the right front injection member 500RF, and the middle rear injection member 500MR is injected into each of the storage chamber 100 through the bottom region injection hole 571B, the middle region injection hole 571M, the top region injection hole 571T of the injection hole plate 570. Thus, the purge gas injected from each of the bottom region injection hole 571B, the middle region injection hole 571M, the top region injection hole 571T is injected to each of the bottom region, the middle region, and the top region in the storage chamber 100.

In other words, in each of the left front injection member 500LF, the right front injection member 500RF, and the middle rear injection member 500MR, the inflow plate 510, the branch passage portion plate 550, and the passages and the holes of the injection hole plate 570 are divided into a bottom region, a middle region, and a top region as described above, that is, three regions in an up- and down-direction. Thus, the bottom region, the middle region, and the top region, that is, three purging regions that result from division in the up-and-down direction (or vertical direction) are also defined in the storage chamber 10.

As described above, the passages and the holes are formed in each of the purging regions, that is, each of the bottom region, the middle region, and the top region in the left front injection member 500LF, so that the flow velocity of the purge gas supplied from the external supply part can be maintained compared to a chamber-type injection member of the wafer storage container in the related art. Thus, the injection speed of the purge gas injected from the injection hole is higher than that of the wafer storage container in the related art, whereby formation of dead regions in the storage chamber 100 can be suppressed.

In addition, each of the three purging regions, that is, each of the bottom region, the middle region, and the top region, corresponds to each ten wafers W (in a case where the thirty wafers W are stored in the storage chamber as described above) such that each ten wafers W are purged in each of the three purging regions. Thus, it is possible to achieve uniform purging of the wafer W.

Moreover, the purge gas can be allowed to be injected only to a desired region in the storage chamber 100 by only selectively blocking the passages communicating with the three purging regions, that is, the passages where the purge gas flows through the supply hole of the lower plate 300. Thus, it is possible to efficiently control the three purging regions in the storage chamber 100.

In other words, when the valve is provided in the external supply part and the valve controls the flow of the purge gas flowing to the left and right side-bottom region supply hole 311, the left and right side-middle region supply hole 311M, and the left and right side-top region supply hole 311T, purging in the bottom region, the middle region, and the top region in the storage chamber 100 can be efficiently controlled.

On the other hand, unlike the above description, the number of purging regions may be equal to or greater than the three purging regions, that is, the bottom region, the middle region, and the top region.

As described above, the wafer storage container according to the preferable embodiment of the present invention can achieve purge gas injection control in the vertical direction in the storage chamber 100.

Furthermore, the supply of the purge gas to the left front injection member 500LF and the right front injection member 500RF is performed by the left and right side-bottom region supply passage 331B, the left and right side-the middle region supply passage 331M, and the left and right side-top region supply passage 331T of the lower plate 300. The supply of the purge gas to the middle rear injection member 500MR is performed by the rear side-bottom region supply passage 331B, the rear side-middle region supply passage 331M, and the rear side-top region supply passage 331T of the lower plate 300. Thus, it is possible to achieve an equivalent injection amount of the purge gas in the storage chamber 100.

In detail, it is assumed that the purge gas is supplied at a flow rate of '2.0' from the external supply part to each of the rear side-bottom region supply passage 331B, the rear side-middle region supply passage 331M, and the rear side-top region supply passage 331T through each of the left and right side-bottom region supply passage 331B, the left and right side-the middle region supply passage 331M, and the left and right side-top region supply passage 331T.

In this case, the purge gas flows at a flow rate of '1.0' into each of the left front injection member 500LF and the right front injection member 500RF through the left and right side-bottom region supply passage 331B, the left and right side-the middle region supply passage 331M, and the left and right side-top region supply passage 331T (because the purge gas is divided to flow to each of the left front injection member and the right front injection member along the rear side-bottom region supply passage 331B, the rear side-middle region supply passage 331M, and the rear side-top region supply passage 331T).

Accordingly, when a flow rate of the purge gas that is supplied from the external supply part to the rear side-bottom region supply passage 333B, the rear side-middle region supply passage 333M, and the rear side-top region supply passage 333T through the rear side-bottom region supply hole 313B, the rear side-middle region supply hole 313M, and the rear top region supply hole 313T is adjusted to '1.0', a flow rate of the purge gas flowing into the middle rear injection member 500MR can be determined to '1.0'.

Thus, as described above, the adjusting of the flow rate of the purge gas supplied from the external supply part to the left and right side-supply passages and to the rear side-supply passages of the supply passage 331 of the lower plate 300 enables that the flow rate of the purge gas flowing into the injection member 500 can be determined to a uniform value. Thus, a flow rate of the purge gas injected into the storage chamber also can be determined to a uniform value.

As described above, the flow rate of the purge gas injected into the storage chamber 100 is adjusted to be uniform whereby the flow of the purge gas in the storage chamber 100 can be facilitated. Thus, it is possible to minimize formation of turbulence attributable to non-uniform flow of the purge gas during injection.

The flow of the purge gas in the storage chamber 100 exhausted through the exhaust member 600 and the flow of the fumes on the wafer W have been described above in the description of the exhaust member 600, so a description thereof will be omitted.

As described above, as shown in FIG. 11, the flow of the purge gas in the wafer storage container 10 according to the preferable embodiment of the present invention is performed such that the purge gas is injected from the left front surface, the right front surface, and the middle rear surface of the circumferential surface of the storage chamber 100 by the left front injection member 500LF, the right front injection member 500, and the middle rear injection member 500MR, and the fumes on the wafer W and the purge gas are exhausted from the right rear surface of the circumferential surface of the storage chamber 100.

Thus, purging of the wafer W can be performed without forming the dead regions where the fumes on the wafer W are not removed, whereby the fumes generated through a manufacturing process of the wafer W can be uniformly removed.

In addition, as described above, the blocking plate 630 of the exhaust member 600 is allowed to be actuated and thus can block exhaust of the exhaust member 600. In this case, the purge gas is injected to fully fill in the storage chamber 100, so that the humidity in the storage chamber 100 can decrease due to the purge gas and moisture removal of the wafer W can thereby be achieved.

Moreover, as described above, in a case where the wafer storage container 10 controls the humidity in the storage chamber 100, the heater rod 590 described above heats the inside of the storage chamber 100 to contribute to controlling the humidity, thus improving humidity control efficiency.

The injection member 500 described above, that is, the left front injection member 500LF, the right front injection member 500, and the middle rear injection member 500MR may have various modifications.

Accordingly, first to third modification of the injection member will be described below in order.

However, a description will be given of the injection member according to the first to third modifications with reference to the left front injection member 500LF of each modification, which may be applicable to other injection members, that is, the right front injection member 500 and the middle rear injection member 500MR.

Furthermore, in the description of the injection member 500, a duplicate description will be omitted, and the duplicate description will be replaced with those mentioned in the above description.

Therefore, the same elements as those of the injection member 500 described above are represented by the same reference numerals. It should be noted that the modified element in the first modification is denoted by using a reference character ('), the modified element in the second modification is denoted by using a reference character ("), and the modified element in the third modification is denoted by using a reference character ('").

An Injection Member 500' According to a First Modification

Hereinafter, with reference to FIGS. 12 and 13, a description will be given of a left front injection member 500'LF according to the first modification applicable to the wafer storage container 10 according to the preferable embodiment of the present invention.

Figure 12:
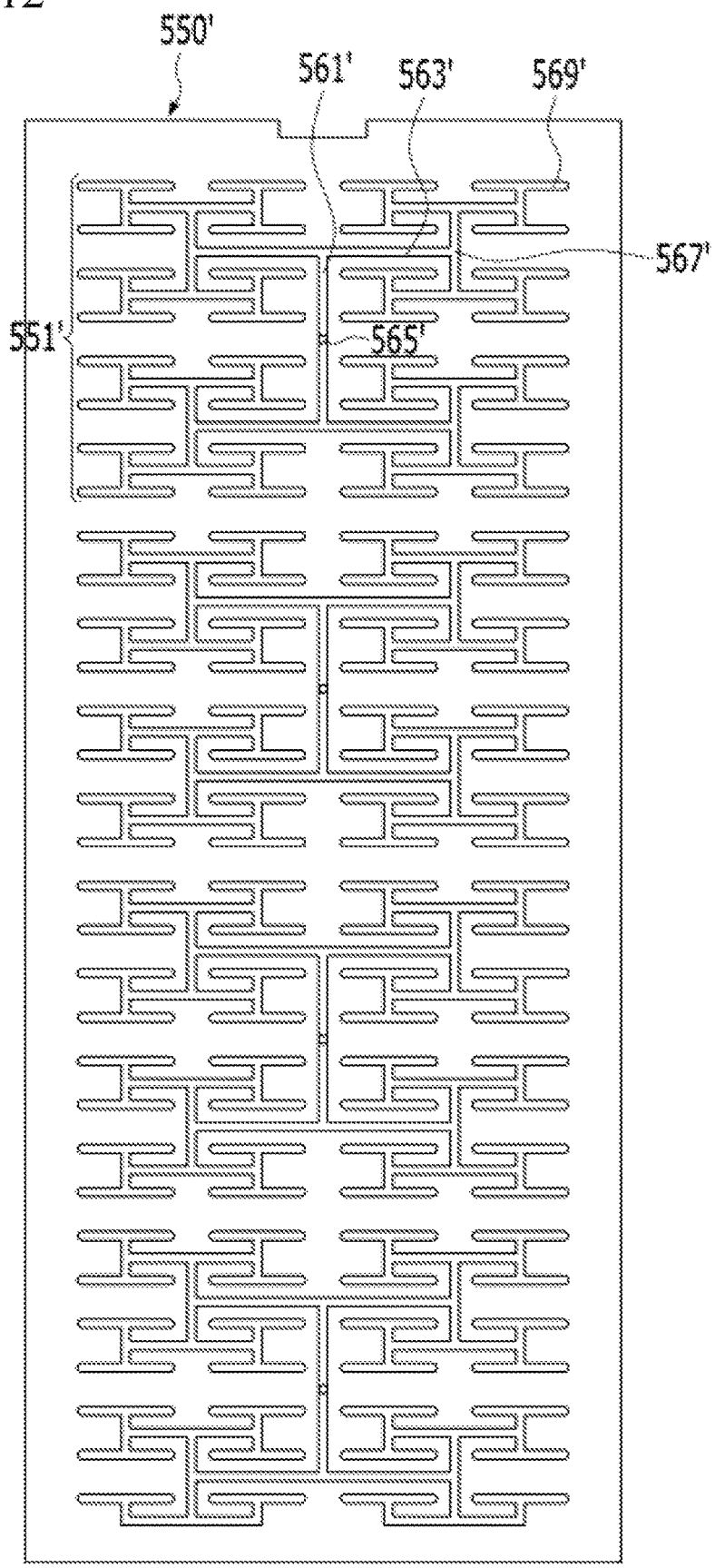
FIG. 12 is a view showing a branch passage portion plate of a left front injection member according to a first modification.
Figure 13:
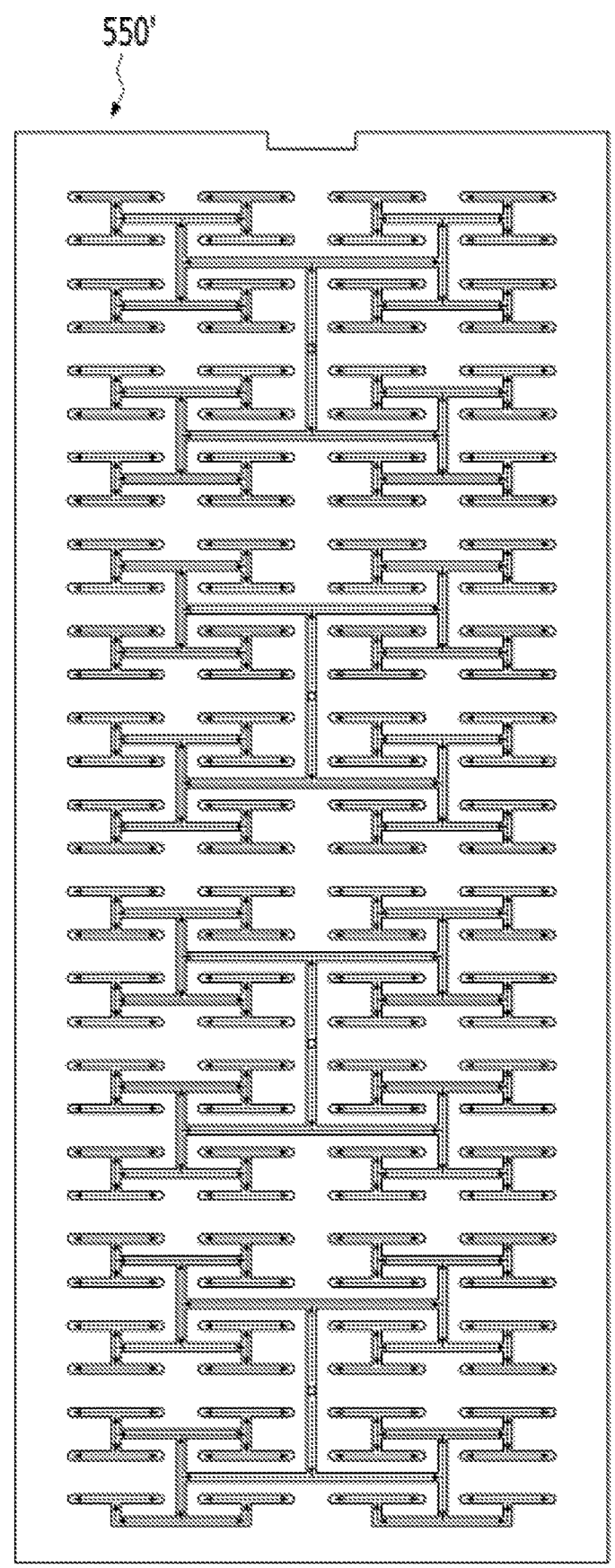
FIG. 13 is a view showing flow of the purge gas flowing through the branch passage portion plate of FIG. 12.

FIG. 12 is a view showing a branch passage portion plate of a left front injection member according to a first modification, and FIG. 13 is a view showing flow of the purge gas flowing through the branch passage portion plate of FIG. 12.

The left front injection member 500'LF according to the first modification includes an inflow plate 510 having a communication hole 511 and an inflow hole 513 that communicate with the supply passage of the lower plate 300, a left front wall 530LF coupled with the inflow plate 510 and forming the left front surface of the storage chamber 100, a branch passage portion plate 550' coupled with the left front wall 530LF and having a branch passage portion 551' communicating with the inflow hole 513, an injection hole plate 570 coupled with the branch passage portion plate 551' and having multiple injection holes 571 communicating with the branch passage portion 551', and a heater rod 590 provided in the inflow plate 510.

The inflow plate 510, the left front wall 530LF, the injection hole plate 570, and the heater rod 590 of the left front injection member 500'LF according to the first modification have the same configuration as the inflow plate 510, the left front wall 530LF, the injection hole plate 570, and the heater rod 590 of the left front injection member 500LF described above, so a description thereof will be omitted.

In other words, the left front injection member 500'LF according to the first modification is an injection member 500' configured such that the branch passage portion 551' of the branch passage portion plate 550' is modified in shape.

However, a hole 565' of a main passage 561' to be described later is four holes 565', so that it is preferable that the inflow hole 513 of the inflow plate 510 is four inflow holes in the same manner. In this case, one of the bottom region inflow hole 513B, the middle region inflow hole 513M, and the top region inflow hole 513T may be two inflow holes 513.

The branch passage portion plate 550' has the branch passage portion 551' communicating with the inflow hole 513 of the inflow hole plate 510, and as shown in FIG. 12, the branch passage portion 551' includes the main passage 561' communicating with the inflow hole 513 of the inflow plate 510, and a branch passage 563' communicating with the main passage 561' and with the multiple injection holes 571 of the injection hole plate 570.

The main passage 561' is formed in a vertical direction of a surface parallel to a portion of the circumferential surface of the storage chamber 100 where the injection member 500' is disposed.

Accordingly, the main passage 561' of the branch passage portion plate 550' of the left front injection member 500'LF is formed in a vertical direction of a surface parallel to the left front surface of the circumferential surface of the storage chamber 100 where the left front injection member 500'LF is disposed (a detailed description thereof is omitted since it has been described in the description of the left front injection member 500' above).

The hole 565' communicating with the inflow hole 513 of the inflow plate 510 is centrally formed at the main passage 561' whereby the purge gas flows into the main passage 561' through the inflow hole 513 of the inflow plate 510 and the hole 565'. In this case, as described above, a total of four holes 565' are formed, one for each branch passage portion 551'.

The branch passage 563' is configured such that two branch passages 563' are branched respectively from opposite ends of the main passage 561' in opposite directions.

Thus, a total of four branch passages 563' are formed at one main passage 561' such that two branch passages 563' are formed at each of upper and lower ends of the main passage, based on one branch passage portion 551'.

In this case, an angle between the main passage 561' and the branch passage 563' is formed at a right angle, that is, 90°, and has a 'T' shape.

Other branch passages 563' are successively formed at ends of the branch passages 563' above, and respective branch passages 563' are branched in a 'T' shape to allow the purge gas to flow in opposite directions.

As described above, the successive branch passages 563' form a successive branch passage 567', and the successive branch passage 567' has an overall shape in which five 'T'-shaped portions are connected to each other ('T'-shaped branch passages are formed successively at ends of a big 'T'-shaped branch passage so as to communicate with each other).

In the case of the successive branch passage 567' as described above, respective branch passages 563' are branched in a 'T' shape to allow the purge gas to flow in opposite directions.

A communication passage 569' is a section where the purge gas finally reaches in the successive branch passage 567'.

The communication passage 569' is arranged at a position corresponding to each of the multiple injection holes 571 of the injection hole plate 570. Accordingly, the purge gas having flowed sequentially along the main passage 561', the branch passage 563', and the successive branch passage 567' through the inflow hole 513 and the holes 565' is injected into the storage chamber 100 from the communication passages 569' through the injection holes 571.

The left front injection member 500'LF according to the first modification having the above configuration has the following advantages.

The structure of the branch passage portion 551' described above enables that when the purge gas having flowed through the holes 565' of the branch passage portion plate 550' is injected from the communication passage 569' through each of the injection holes 571, the purge gas has the same flow distance.

Thus, the flow rate of the purge gas injected through the multiple injection holes 571 can be maintained uniform, whereby uniform purge gas injection can be performed in the storage chamber 100.

In addition, the uniform purge gas injection in the storage chamber 100 can minimize formation of turbulence attributable to non-uniform flow of the purge gas during injection in the storage chamber 100.

In detail, when the flow rate of the purge gas injected into the storage chamber 100 is not relatively uniform and thus is concentrated to one side, the flow of the purge gas in the storage chamber 100 may create turbulence.

Thus, the flow of the purge gas flowing on the upper surface of each wafer W may not be efficiently performed, and the flow of the purge gas may be concentrated only in a certain region. This flow of the purge gas promotes formation of the dead regions where the fumes on the wafer W are not removed, causing that fume removal and humidity control of the wafer W may not be achieved.

However, when the injection member 500' according to the first modification is applied to the wafer storage container 10, as shown in FIG. 13, the purge gas flowing from the inflow hole 513 to each of the injection holes 571 has the same flow distance, whereby a uniform flow rate of the purge gas injected through the injection holes 571 can be ensured. Thus, it is possible to prevent a phenomenon where turbulence occurs in the storage chamber 100, which may occur in the wafer storage container in the related art, and thereby to significantly increase efficiency of purging of the wafer W.

Moreover, branch sections of both the branch passage 563' and the successive branch passage 567' have a rectangular shape, that is, the successive 'T' shapes, so that the branch passage portion 551' can be formed without wasting the area of the surface having the branch passage portion 551' of the branch passage portion plate 550 formed thereon.

Thus, it is possible to minimize the size of the branch passage portion plate 550' and thereby to minimize the size of the injection member 500', thus achieving a size reduction of the wafer storage container 10.

An Injection Member 500" According to a Second Modification

Hereinafter, with reference to FIG. 14 to FIG. 18, a description will be given of a left front injection member 500"LF according to the second modification applicable to the wafer storage container 10 according to the preferable embodiment of the present invention.

Figure 14:
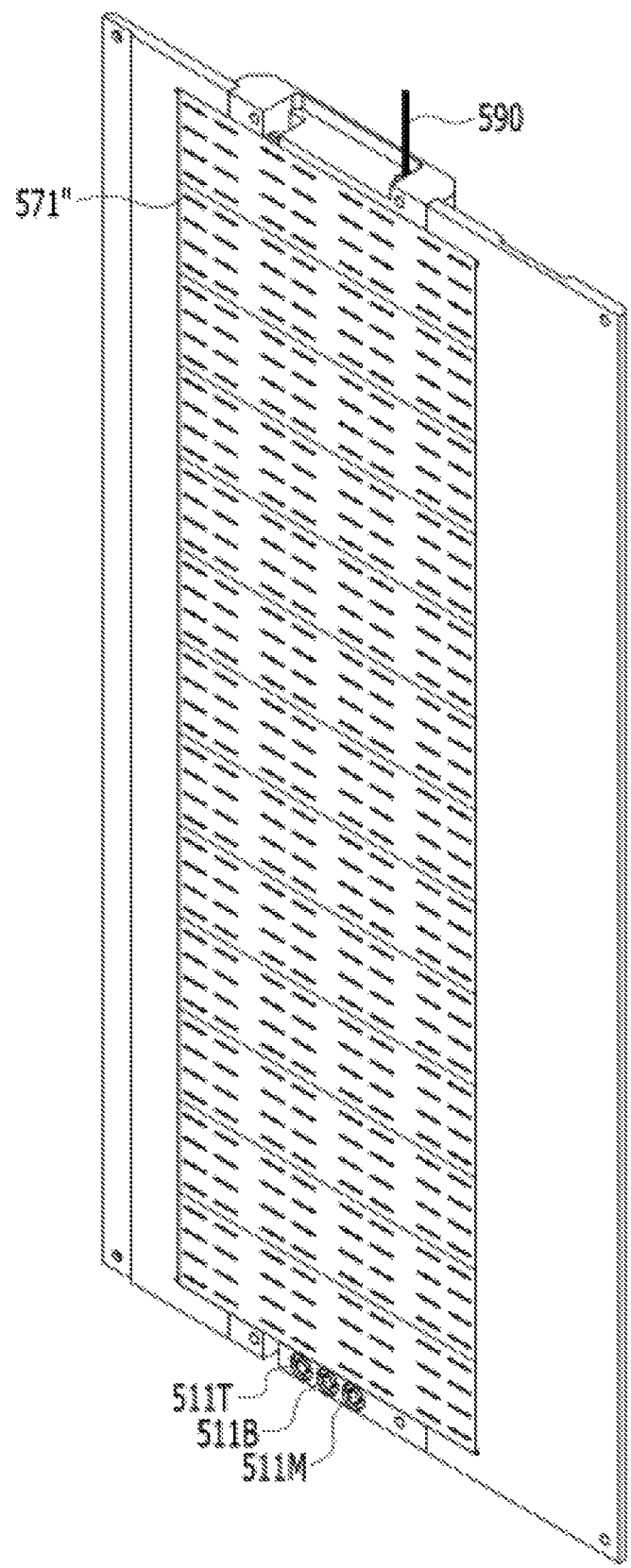
FIG. 14 is a perspective view showing a left front injection member according to a second modification.
Figure 15:
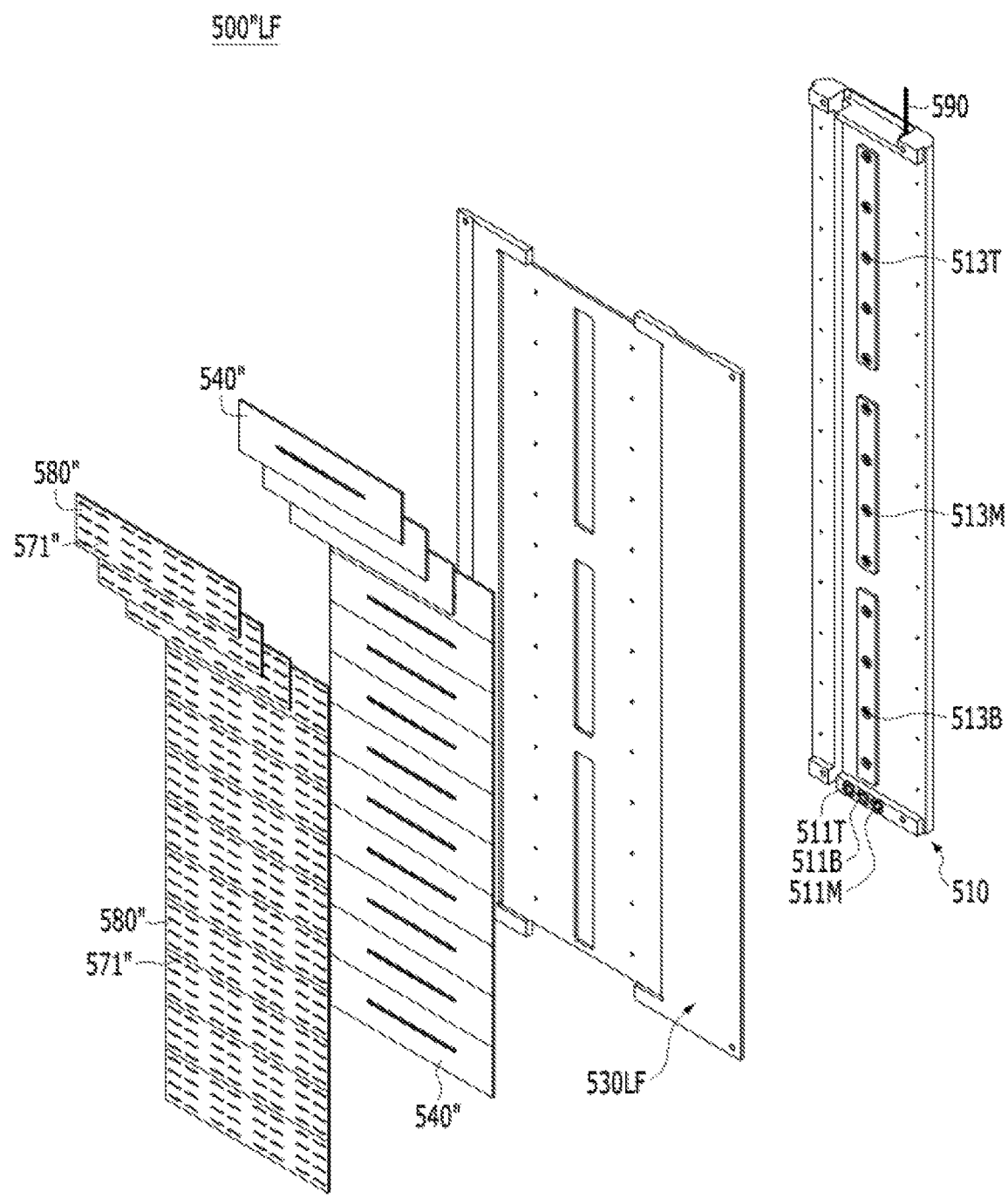
FIG. 15 is an exploded perspective view of FIG. 14.
Figure 16A:
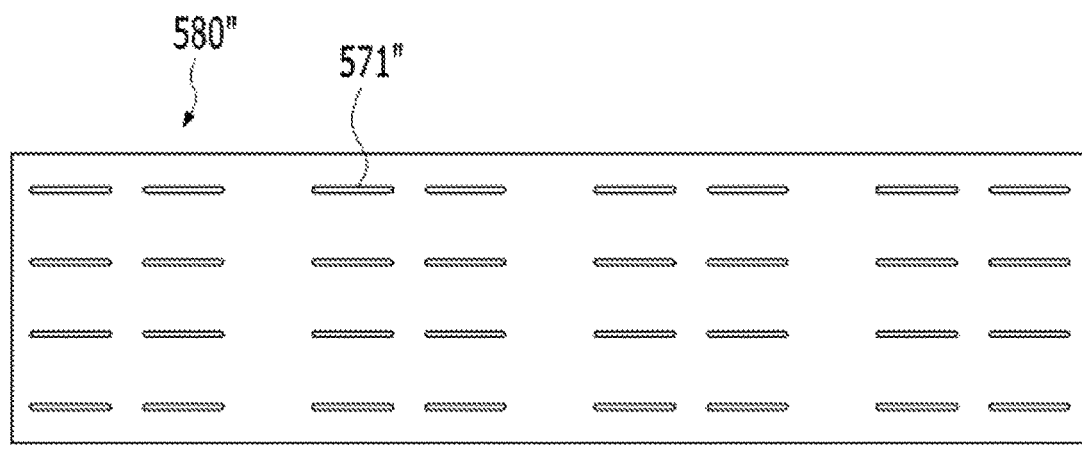
FIG. 16(a) is a view showing a front surface of an injection plate of FIG. 15.
Figure 16B:
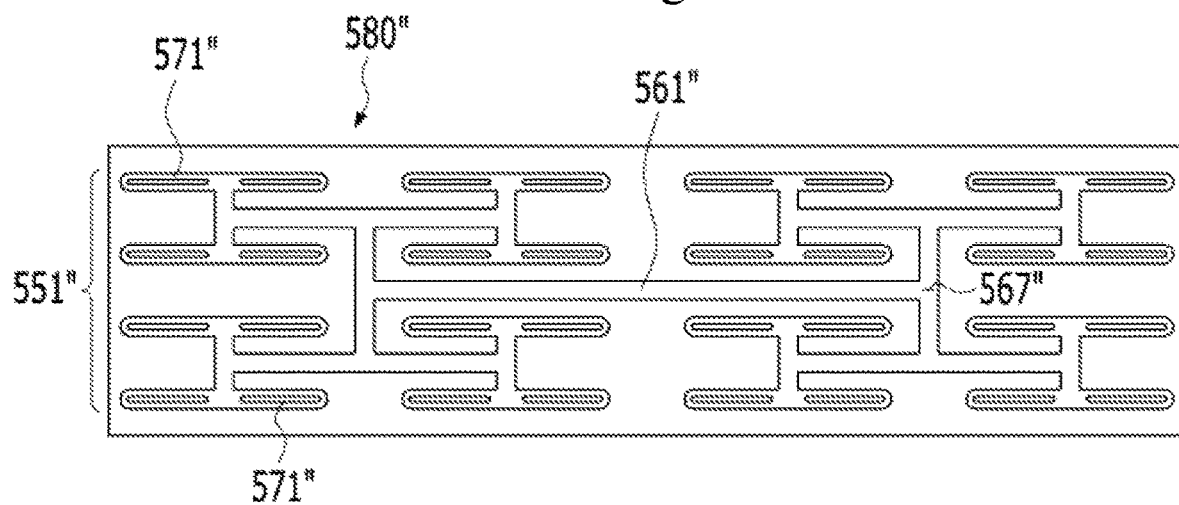
FIG. 16(b) is a view showing a rear surface of the injection plate of FIG. 15.
Figure 18:
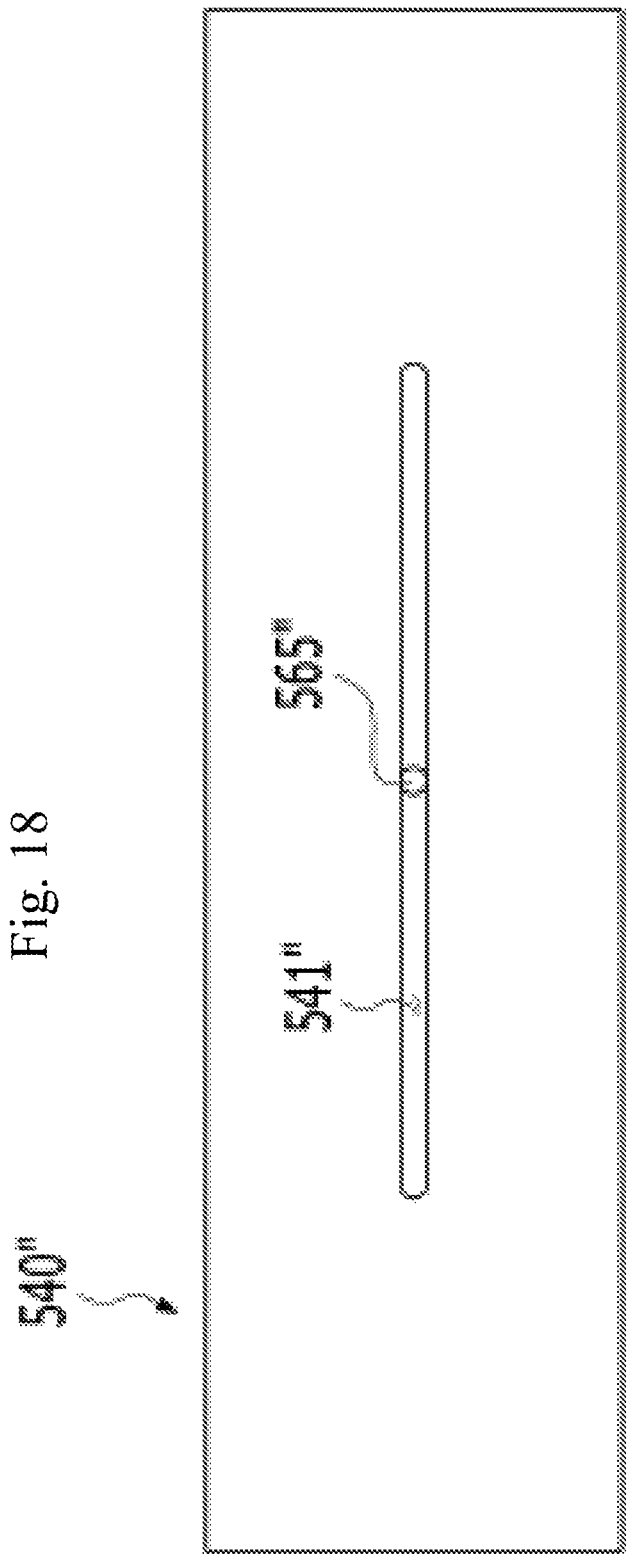
FIG. 18 is a view showing a front surface of an additional passage plate of FIG. 15.

FIG. 14 is a perspective view showing a left front injection member according to a second modification, FIG. 15 is an exploded perspective view of FIG. 14, FIG. 16(a) is a view showing a front surface of an injection plate of FIG. 15, FIG. 16(b) is a view showing a rear surface of the injection plate of FIG. 15, FIG. 17 is a view showing flow of the purge gas flowing through the injection plate of FIG. 16(b), and FIG. 18 is a view showing a front surface of an additional passage plate of FIG. 15.

As shown in FIGS. 14 and 15, the left front injection member 500"LF according to the second modification includes an inflow plate 510 having a communication hole 511 and an inflow hole 513 that communicate with the supply passage of the lower plate 300, a left front wall 530LF coupled with the inflow plate 510 and forming the left front surface of the storage chamber 100, an injection plate 580" coupled with the left front wall 530LF, and having a branch passage portion communicating with the inflow hole and having multiple injection holes 571 communicating with the branch passage portion, an additional passage plate 540" interposed between the inflow plate 510 and the injection plate 580" and having an additional passage 541" allowing the inflow hole 513 and the branch passage portion 551" to communicate with each other, and a heater rod 590 provided in the inflow plate 510.

The inflow plate 510, the left front wall 530LF, and the heater rod 590 of the left front injection member 500"LF according to the second modification have the same configuration as the inflow plate 510, the left front wall 530LF, and the heater rod 590 of the left front injection member 500LF described above, so a duplicate description will be omitted.

In other words, the left front injection member 500"LF according to the second modification is an injection member 500" configured such that the branch passage portion plate 550 and the injection hole plate 570 of the left front injection member 500LF described above is modified into one injection plate 580".

However, the number of holes 565" of the additional passage 541" to be described later is thirteen, so that it is preferable that the number of inflow holes 513 of the inflow plate 510 is thirteen that is the same as the number of holes 565".

In this case, one of the bottom region inflow hole 513B, the middle region inflow hole 513M, and the top region inflow hole 513T may be five inflow holes 513, and each remaining inflow hole may be four inflow holes (five bottom region inflow holes 513B are shown in FIG. 15).

As shown in FIGS. 14 and 15, multiple injection plates 580" and multiple additional passage plate 540" are provided and are coupled to the left front wall 530LF.

In FIGS. 14 and 15, as an example, thirteen injection plates 580" and thirteen additional passage plates 540" are provided. As such, it is preferable that the injection plates 580" and the additional passage plate 540" are provided to have the same number.

In the case of the injection plate 580", the multiple injection holes 571" are formed on a first surface (front surface) of the injection plate 580" as shown in FIG. 16(a), and the branch passage portion 551" is formed on a second surface (rear surface) of the injection plate 580" as shown in FIG. 16(b).

In other words, the injection holes 571" and the branch passage portion 551" are formed on opposite surfaces of the injection plate 580", whereby one injection plate 580" functions as both the injection hole plate 570 and the branch passage portion plate 550.

The branch passage portion 551" formed on the second surface of the injection plate 580" has a main passage 561" communicating with the additional passage 541" of the additional passage plate 540", and a successive branch passage 567" is successively branched from each of opposite ends of the main passage 561".

The successive branch passage 567" is configured such that the branch passages are branched successively in a 'T' shape, and has an overall shape in which five 'T'-shaped portions are connected to each other ('T'-shaped branch passages are formed successively at ends of a big 'T'-shaped branch passage so as to communicate with each other) in the same manner as the successive branch passage 567' of the left front injection member 500'LF according to the first modification described above.

In this case, the branch passages of the successive branch passage 567" are branched such that respective branch passages are branched in a 'T' shape to allow the purge gas to flow in opposite directions.

The successive branch passage 567" has the multiple injection holes 571" open sideward and formed in sections in which the purge gas finally reaches in the successive branch passage.

As shown in FIG. 18, the additional passage plate 540" has the additional passage 541" formed on a surface (front surface) thereof, and the additional passage 541" has the hole 565", and the hole 565" functions to allow the inflow hole 513 of the inflow plate 510 and the main passage 561" of the branch passage portion 551" of the injection plate 580" to communicate with each other. In this case, the additional passage 541" and the main passage 561" have the same length, height, and width, that is, the same volume, and the hole 565" is positioned at the lengthwise center of the additional passage 541".

The left front injection member 500"LF according to the second modification having the above configuration has the following advantages.

First, the injection plate 580" has both the multiple injection holes 571" and the branch passage portion 551", so that unlike the left front injection member 500'LF according to the first modification, one injection plate 580" functions as both the injection hole plate 570 and the branch passage portion plate 550' of the left front injection member 500'LF according to the first modification. Thus, it is possible to achieve a reduction in manufacturing cost and to achieve a size reduction of the left front injection member 500"LF.

In addition, the multiple injection plates 580" and the additional passage plate 540" are coupled to the left front wall 530LF, so that in a case where the wafer storage container 10 is used for a long period of time and thus contaminants accumulate in the passages of the left front injection member 500"LF, it is possible to easily replace only a heavily contaminated part and thereby to achieve easy maintenance.

Moreover, in the flow and injection of the purge gas in the left front injection member 500"LF according to the second modification, when the purge gas inflows through the holes 565" communicating with the inflow hole 513 of the inflow plate 510, as shown in FIG. 17, the purge gas flows along the additional passage 541" and the main passage 561" to flow to the successive branch passages 567" communicating with the main passage 561". Accordingly, the purge gas having flowing to the successive branch passages 567" is finally injected into the storage chamber 100 through the multiple injection holes 571".

As described above, in a case where the purge gas flows along the branch passage portion 551" of the left front injection member 500"LF according to the second modification for injection, when the purge gas having flowed through the holes 565' of the additional passage 541" is injected through each of the injection holes 571, the purge gas has the same flow distance, like the branch passage portion 551' of the left front injection member 500'LF according to the first modification.

Thus, the purge gas can be uniformly injected into the storage chamber 100, thus suppressing formation of turbulence in the storage chamber 100, whereby efficiency of purging of the wafer W in the wafer storage container 10 can be significantly increased.

Furthermore, as described above, the additional passage 541" and the main passage 561" have the same shape, so that the width of the additional passage 541" and the main passage 561" is greater than the width of the main passage 561' of the branch passage portion 551' of the left front injection member 500'LF according to the first modification.

As described above, the width of the additional passage 541" and the main passage 561" increases, so that when the purge gas flows to the successive branch passage 567" communicating with the main passage 561", the flow velocity of the purge gas may further increase due to the volume difference between the passages, thereby further increasing the injection speed of the purge gas injected through the injection holes 571".

This is because the flow velocity of gas is inversely proportional to the cross-sectional area, so that when the purge gas flows from the main passage 561" and the additional passage 541" that have a relatively large cross-sectional area to the successive branch passage 567" having a relatively small cross-sectional area, the flow velocity of the purge gas may instantaneously increase.

As described above, the injection speed of the purge gas injected into the storage chamber 100 through the injection holes 571" increases, so that the flow rate of the purge gas also increases. Accordingly, much purge gas can be injected into the storage chamber 100 and much purge gas can be injected with a long flow distance (in other words, the injection area of the purge can increase).

Thus, the left front injection member 500"LF according to the second modification can achieve purge gas injection with higher efficiency than the left front injection member 500'LF according to the first modification.

An Injection Member 500''' According to a Third Modification

Hereinafter, a left front injection member 500'''LF, a right front injection member 500'''RF, and a middle rear injection member 500"MR according to the third modification, which are applicable to the wafer storage container 10 according to the preferable embodiment of the present invention, will be described with reference to FIGS. 19 to 22.

It is noted that in the following description, multiple injection holes ''' are divided into small injection holes 571'''S (571''' SMALL), regular injection holes 571'''R (571''' REGULAR), and large injection holes 571'''L (571''' LARGE) according to the opening area thereof.

In this case, a ratio of the opening areas of the small injection holes 571'''S, the regular injection holes 571'''R, and the large injection holes 571'''L is '1:2:4'.

Figure 19A:
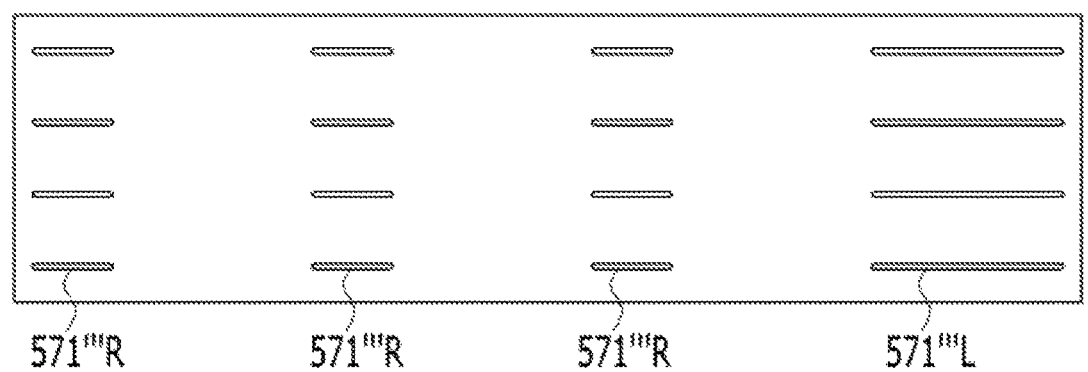
FIG. 19(a) is a view showing a front surface of an injection plate of a left front injection member according to a third modification.
Figure 19B:
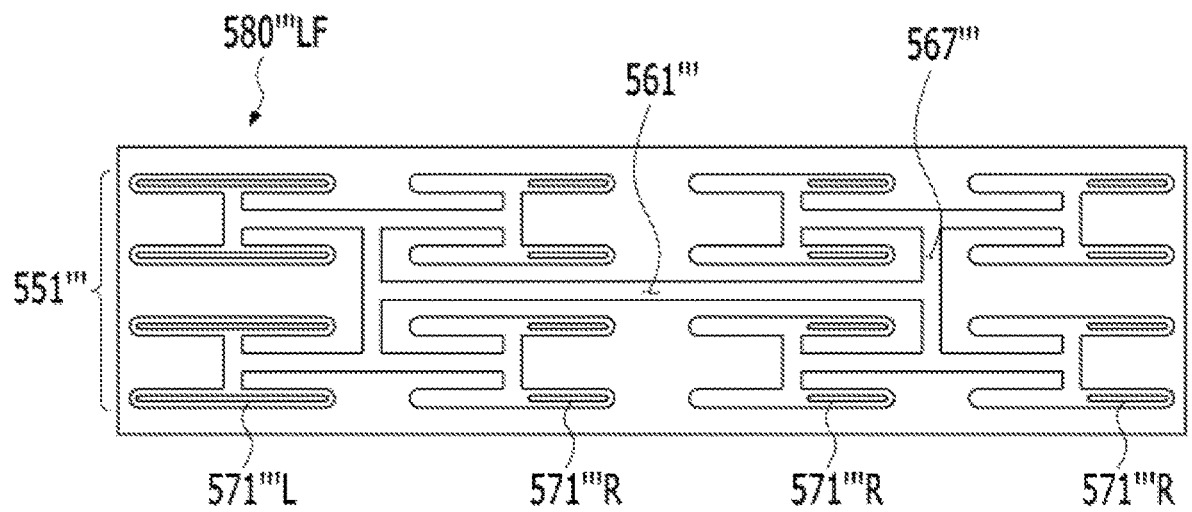
FIG. 19(b) is a view showing a rear surface of the injection plate of the left front injection member according to the third modification.
Figure 20A:
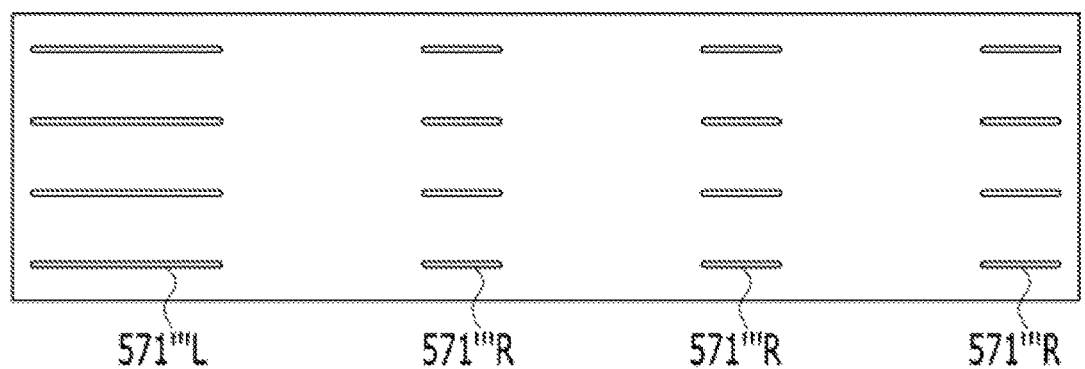
FIG. 20(a) is a front view showing a front surface of an injection plate of a right front injection member according to the third modification.
Figure 20B:
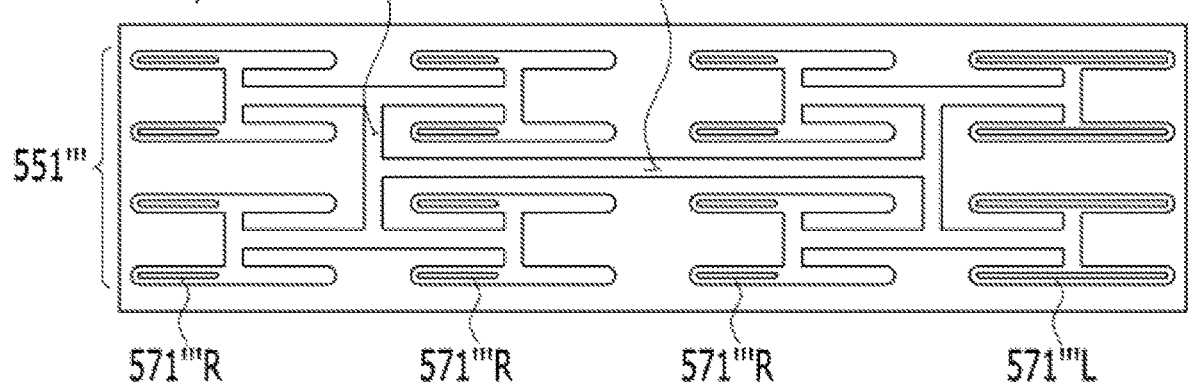
FIG. 20(b) is a view showing a rear surface of the injection plate of the right front injection member according to the third modification.
Figure 21A:
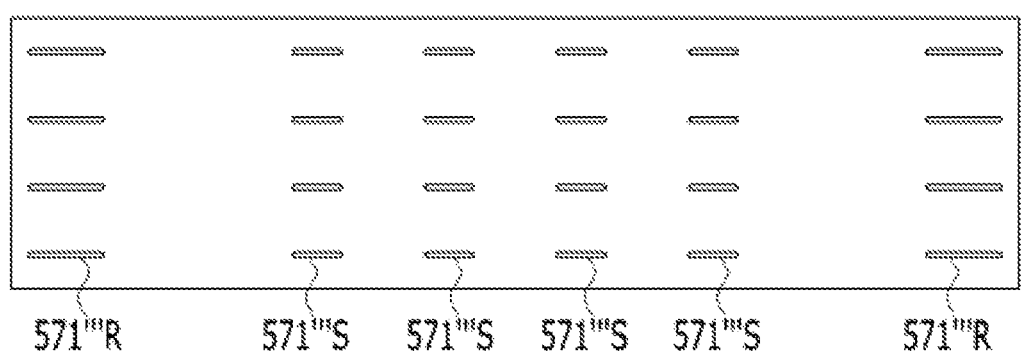
FIG. 21(a) is a view showing a front surface of an injection plate of a middle rear injection member according to the third modification.
Figure 21B:
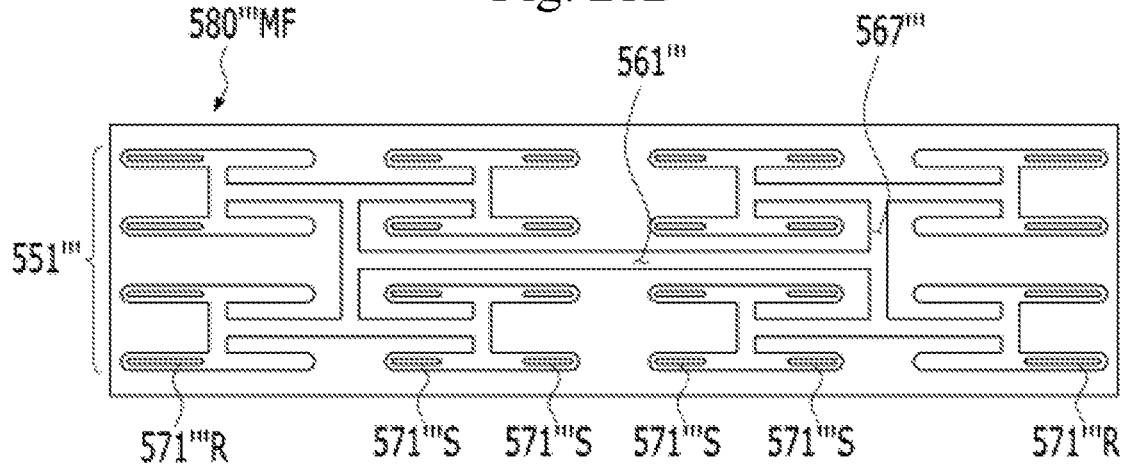
FIG. 21(b) is a view showing a rear surface of the injection plate of the middle rear injection member according to the third modification.
Figure 22:
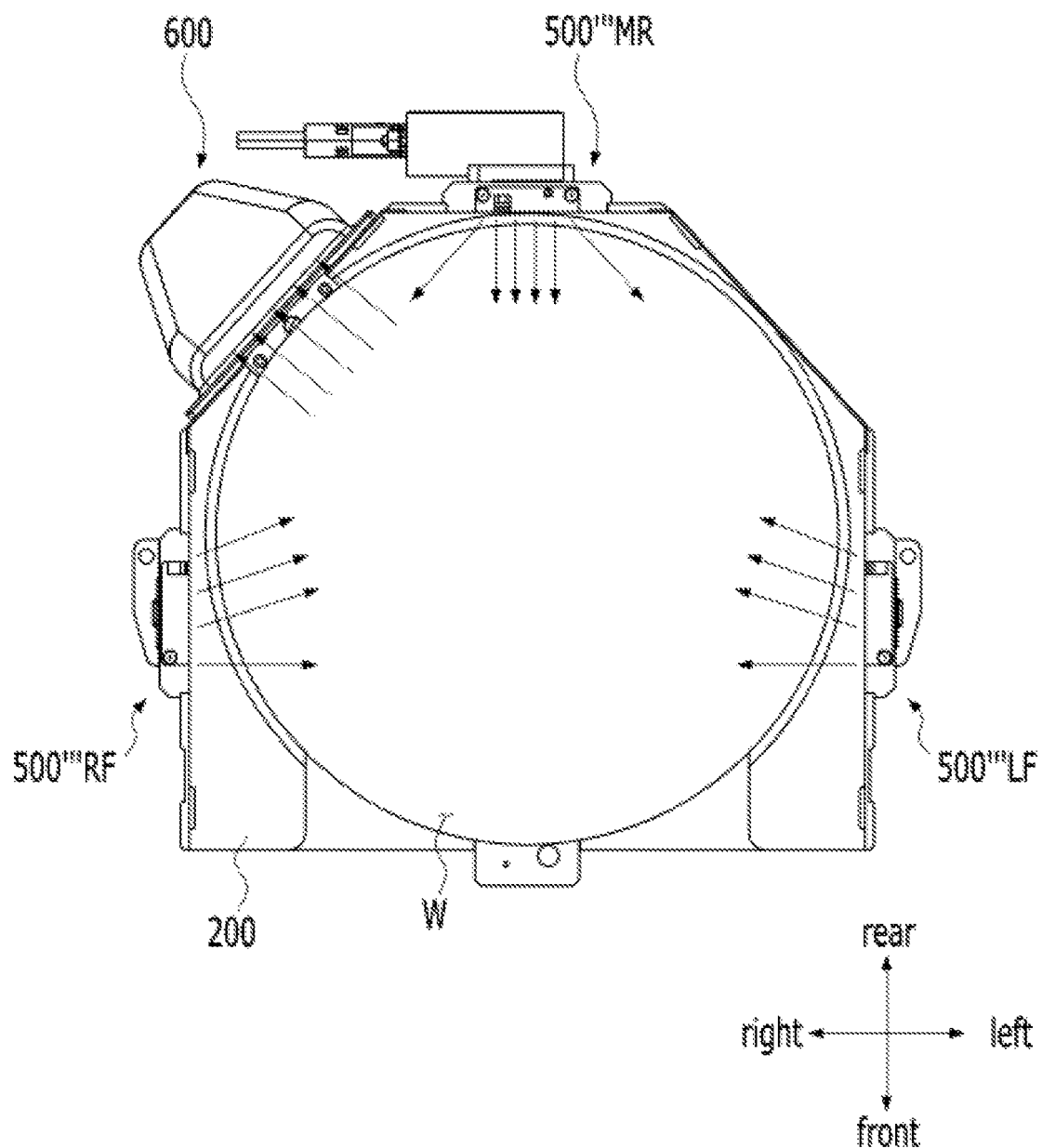
FIG. 22 is a view showing flow of the purge gas injected on the wafer supported on the support of the wafer storage container equipped with the injection members according to a third modification and flow of the purge gas and the fumes that are exhausted to the exhaust member.

FIG. 19(a) is a view showing a front surface of an injection plate of a left front injection member according to a third modification, FIG. 19(b) is a view showing a rear surface of the injection plate of the left front injection member according to the third modification, FIG. 20(a) is a front view showing a front surface of an injection plate of a right front injection member according to the third modification, FIG. 20(b) is a view showing a rear surface of the injection plate of the right front injection member according to the third modification, FIG. 21(a) is a view showing a front surface of an injection plate of a middle rear injection member according to the third modification, FIG. 21(b) is a view showing a rear surface of the injection plate of the middle rear injection member according to the third modification, and FIG. 22 is a view showing flow of the purge gas injected on the wafer supported on the support of the wafer storage container equipped with the injection members according to a third modification and flow of the purge gas and the fumes that are exhausted to the exhaust member.

The injection member 500''' according to the third modification, that is, each of the left front injection member 500'''LF, the right front injection member 500'''RF, and the middle rear injection member 500'''MR, includes an inflow plate 510 having a communication hole 511 and an inflow hole 513 that communicate with the supply passage of the lower plate 300, the left front wall 530LF, the right front wall 530RF, and the middle rear wall 530MR that are coupled with the inflow plate 510 and respectively form the left front surface, the right front injection member 500RF, and the middle rear injection member 500MR of the circumferential surface of the storage chamber 100 (the left front injection member 500LF includes the left front wall 530LF, the right front injection member 500RF includes the right front wall 530RF, and the middle rear injection member 500MR includes the middle rear wall 530MR), an additional passage plate 540''' interposed between the inflow plate 510 and an injection plate 580''' and having an additional passage 541''' allowing the inflow hole 513 and a branch passage portion 551''' to communicate with each other, and a heater rod 590 provided in the inflow plate 510.

In this case, the left front injection member 500'''LF, the right front injection member 500'''RF, and the middle rear injection member 500'''MR according to the third modification, and left front injection member 500''LF according to the second modification differ only in the shape of the injection holes 571'' of the injection plate 580'', but remain the same in the remaining configurations (of course, the disposition positions thereof are different from each other). Therefore, a duplicate description will be omitted.

In other words, the left front injection member 500'''LF, the right front injection member 500'''RF, and the middle rear injection member 500'''MR according to the third modification is an injection member 500''' configured such that only the injection hole 571'' is modified in shape in the left front injection member 500''LF according to the second modification.

First, the shape of the injection holes 571''' of an injection plate 580''LF of the left front injection member 500'''LF will be described.

Referring to FIG. 19(a), of the multiple injections holes 571''' of the injection plate 580'''LF, injection holes 571''' corresponding to first to third rows form the regular injection holes 571'''R, and injection holes 571''' corresponding to a fourth row form the large injection holes 571'''L.

In this case, as shown in FIG. 19(b), each of the regular injection holes 571'''R is formed such that each of horizontal extended end passages of the 'I'-shaped branch passages where the purge gas finally reaches in the successive branch passage 567''' is open only at a side thereof (right side with reference to FIG. 19(b)).

Furthermore, as shown in FIG. 19(b), each of the large injection holes 571'''L is formed such that each of horizontal extended end passages of the 'I'-shaped branch passages where the purge gas finally reaches in the successive branch passage 567''' is open at opposite sides thereof.

Hereinafter, the shape of the injection holes 571''' of the injection plate 580'' of the right front injection member 500'''RF will be described.

Referring to FIG. 20(a), of the multiple injections holes 571''' of the injection plate 580'''RF, injection holes 571''' corresponding to second to fourth rows form the regular injection holes 571'''R, and injection holes 571''' corresponding to a first row form the large injection holes 571'''L.

In this case, as shown in FIG. 20(b), each of the regular injection holes 571'''R is formed such that each of horizontal extended end passages of the 'I'-shaped branch passages where the purge gas finally reaches in the successive branch passage 567''' is open only at a side thereof (left side with reference to FIG. 20(b)).

Furthermore, as shown in FIG. 19(b), the large injection holes 571'''L are formed such that each of horizontal extended end passages of the 'I'-shaped branch passages where the purge gas finally reaches in the successive branch passage 567''' is open at opposite sides thereof.

Hereinafter, the shape of the injection holes 571''' of the injection plate 580''' of the middle rear injection member 500'''MR will be described.

Referring to FIG. 21(a), of the multiple injection holes 571''' of the injection plate 580'''MR, injection holes 571''' corresponding to first and sixth rows form the regular injection holes 571'''R, and injection holes 571''' corresponding to second to fifth rows form the small injection holes 571'''S.

In this case, as shown in FIG. 21(b), each of the regular injection holes 571'''R is formed such that each of horizontal extended end passages of the 'I'-shaped branch passages where the purge gas finally reaches in the successive branch passage 567''' is open only at a side thereof (left or right side with reference to FIG. 21(b)).

Furthermore, as shown in FIG. 19(b), each of the small injection holes 571'''S is formed such that each of horizontal extended end passages of the 'I'-shaped branch passages where the purge gas finally reaches in the successive branch passage 567''' is open at opposite sides thereof, and half of the small injection hole is open (the opening area of the small injection hole corresponds to half of the opening area of each of the regular injection holes 571'''R described above).

Hereinafter, the flow of the purge gas injected through the injection member 500''' according to the third modification will be described with reference to FIG. 22.

However, as described above, the ratio of the opening areas of the small injection holes 571'''S, the regular injection holes 571'''R, and the large injection holes 571'''L is '1:2:4', so that a ratio of an injection amount of the purge gas injected through the small injection holes 571'''S, the regular injection holes 571'''R, and the large injection holes 571'''L is also '1:2:4'.

The purge gas that is injected through the large injection holes 571'''L positioned in the first row of the injection plate 580'''LF of the left front injection member 500'''LF and the purge gas that is injected through the large injection holes positioned in the fourth row of the injection plate 580'''RF of the right front injection member 500'''RF are straightly injected onto the wafer W.

The purge gas that is injected through the regular injection holes 571'''R positioned in the second to fourth rows of the injection plate 580'''LF of the left front injection member 500'''LF and the purge gas that is injected through the regular injection holes positioned in the second to fourth rows of the injection plate 580'''RF of the right front injection member 500'''RF are inclinedly injected in a rear direction of the storage chamber 100. This is because the regular injection holes 571'''R are only formed at the sides of the horizontal ends of the 'I'-shaped portions of the branch passage portion 551''', so that the purge gas flows inclinedly.

The purge gas that is injected through the regular injection holes 571'''R positioned in the first and sixth rows of the injection plate 580'''MR of the middle rear injection member 500'''MR is inclinedly injected in a left front direction and in a right rear direction of the storage chamber 100, respectively. The purge gas that is injected through the small injection holes 571'''S positioned in the second to fifth rows of the injection plate 580'''MR of the middle rear injection member 500'''MR is straightly injected onto the wafer W.

As described above, the purge gas that is injected through the regular injection holes 571'''R positioned in the second to fourth rows of the injection plate 580'''LF of the left front injection member 500'''LF and the purge gas that is injected through the regular injection holes positioned in the second to fourth rows of the injection plate 580'''RF of the right front injection member 500'''RF are injected and flow in a left rear direction of the upper surface of the wafer W. The purge gas that is injected through the regular injection holes 571'''R positioned in the first and sixth rows of the injection plate 580'''MR of the middle rear injection member 500'''MR is injected and flows in a right rear direction of the upper surface of the wafer W. Thus, the dead regions of the wafer W can be filled (compare with FIG. 11).

In other words, as shown in FIG. 22, the purge gas is injected leftwards and rightwards from opposite sides, that is, left right sides of the middle rear injection member 500'''MR, and the purge gas is injected from each of the left front injection member 500'''LF and the right front injection member 500'''RF rearwards. Thus, the flow of the purge gas can be filled with respect to the left rear and right rear surfaces of the storage chamber 100 where no injection member 500''' is disposed, thus minimizing formation of the dead regions with respect to the left rear and right rear surfaces of the storage chamber 100.

In addition, in view of the ratio of the opening areas of the injection holes 571''' described above, the purge gas having a flow rate of '4.0' is injected through the large injection holes 571'''L positioned in the first row of the injection plate 580'''LF of the left front injection member 500'''LF, and the purge gas having a flow rate of '4.0' is injected through the large injection holes 571'''L positioned in the fourth row of the injection plate 580'''RF of the right front injection member 500'''RF. Thus, a large amount of purge gas is injected in a direction of the front opening 110 of the storage chamber 100 whereby external gas can be prevented from flowing into the storage chamber 100.

Moreover, the purge gas having a flow rate of '2.0' is injected through the regular injection holes 571'''R positioned in the first and sixth rows of the injection plate 580'''MR of the middle rear injection member 500'''MR inclinedly in the left front direction and in the right rear direction of the storage chamber 100, respectively. Thus, when the purge gas and the fumes are exhausted through the exhaust member 600, the flow of the purge gas contributes to exhaust of the purge gas and the fumes, thus facilitating efficient purging of the wafer storage container.

As described above, the injection member 500''' according to the third modification has the injection holes 571''' configured with the small injection holes 571'''S, the regular injection holes 571'''R, and the large injection holes 571'''L that are formed according to the size, and thus to control the injection direction and the flow rate of the purge gas. Thus, the flow of the purge gas in the storage chamber 100 can be controlled, whereby it is possible to minimize formation of the dead regions where the fumes on the wafer W are not removed and to achieve formation of flow of the purge gas in the storage chamber 100.

Of course, depending on the disposition position of the injection member disposed in the wafer storage container 10 described above, the injection holes may vary in the position and opening area unlike the injection member 500''' according to the third modification. Thus, it is possible to manufacture the wafer storage container 10 capable of achieving an optimized flow of the purge gas in the storage chamber 100 in accordance with the disposition position of the injection member of the wafer storage container 10.

Although a preferred embodiment of the present invention has been described for illustrative purposes, those skilled in the art will appreciate that various modifications, additions and substitutions are possible, without departing from the scope and spirit of the invention as disclosed in the accompanying claims.

Description of the Reference Numerals in the Drawings

| | |
|---|---|
| 10: wafer storage container | 100: storage chamber |
| 110: front opening | 130LR: left rear wall |
| 200: support | |
| 210: support coupling portion | |
| 230: step | 250: protruding pin |
| 300: lower plate | 311: supply hole |
| 311B: left and right side-bottom region supply hole | |
| 311M: left and right side-middle region supply hole | |
| 311T: left and right side-top region supply hole | |
| 313B: rear side-bottom region supply hole | |
| 313M: rear side-middle region supply hole | |
| 313T: rear top region supply hole | |
| 331: supply passage | |
| 331B: left and right side-bottom region supply passage | |
| 331M: left and right side-middle region supply passage | |
| 331T: left and right side-top region supply passage | |
| 333B: rear side-bottom region supply passage | |
| 333M: rear side-middle region supply passage | |
| 333T: rear side-top region supply passage | |
| 400: upper plate | |
| 500, 500', 500'', 500''': injection member | |
| 500LF, 500'LF, 500''LF, 500''' 'LF: left front injection member | |
| 500RF, 500'RF, 500''RF, 500''' 'RF: left front injection member | |
| 500MR, 500'MR, 500''MR, 500''' 'MR: middle rear injection member | |

| | |
|---|---|
| 530: wall | 530LF: left front wall |
| 530RF: right front wall | 530MR: middle rear wall |
| 540": additional passage plate | |
| 541": additional passage | |
| 550, 550': branch passage portion plate | |
| 551, 551', 551", 551"  ': branch passage portion | |
| 551B: bottom region branch passage portion | |
| 551M: middle region branch passage portion | |
| 551T: top region branch passage portion | |
| 561, 561', 561", 561" ': main passage | |
| 563, 563': branch passage | |
| 565, 565', 565": hole | |
| 567', 567", 567" ': successive branch passage | |
| 569': communication passage | |
| 570: injection hole plate | |
| 571, 571", 571" ': injection hole | |
| 571B: bottom region injection hole | |
| 571M: middle region injection hole | |
| 571T: top region injection hole | |
| 571" 'S: small injection hole | |
| 571" 'R: regular injection hole | |
| 571" 'L: large injection hole | |
| 580", 580" ', 580" 'LF, 580" 'RF, 580" 'MR: injection plate | |
| 590: heater rod | 600: exhaust member |
| 610: exhaust hopper | 611: exhaust outlet |
| 630: blocking plate | 631: actuating portion |
| 633: exhaust communication holes | |
| 650: exhaust hole plate | |
| 651: exhaust holes | |

The invention claimed is:

1. A wafer storage container, comprising:
a storage chamber in which a wafer received through a front opening is stored; and
an injection member disposed on at least a portion of a circumferential surface of the storage chamber and injecting purge gas into the storage chamber,
wherein the injection member includes:
an inflow hole through which the purge gas flows into the injection member;
multiple injection holes arranged on the portion of the circumferential surface of the storage chamber such that the purge gas is injected into the storage chamber through the injection holes;
a branch passage portion having at least one branch section such that the purge gas having flowed through the inflow hole is allowed to flow to the multiple injection holes, the branch passage portion being provided on a surface parallel to the portion of the circumferential surface of the storage chamber;
an injection plate having the multiple injection holes and the branch passage portion; and
an inflow plate coupled to the injection plate and having the inflow hole,
wherein the multiple injection holes are formed on a first surface of the injection plate, and the branch passage portion is formed on a second surface of the injection plate.

2. The wafer storage container of claim 1, wherein the branch passage portion includes:
a main passage communicating with the inflow hole and formed in a vertical direction of the surface parallel to the portion of the circumferential surface of the storage chamber; and
multiple branch passages allowing the main passage and each of the multiple injection holes to communicate with each other, and configured such that the branch passages are branched symmetrically with each other with respect to the main passage to form the branch section, the branch passages being formed in horizontal directions of the surface parallel to the portion of the circumferential surface of the storage chamber.

3. The wafer storage container of claim 2, wherein the inflow hole is formed to be positioned at a center of a vertical length of the main passage.

4. The wafer storage container of claim 1, wherein the purge gas having flowed from the inflow hole to each of the multiple injection holes through the branch passage portion has the same flow distance.

5. The wafer storage container of claim 4, wherein the branch section of the branch passage portion is formed such that two branch passages are branched in opposite directions.

6. The wafer storage container of claim 1, wherein the injection member is disposed between the injection plate and the inflow plate and further includes:
an additional passage plate having an additional passage allowing the inflow hole and the branch passage portion to communicate with each other.

* * * * *